(12) United States Patent
Iwamura et al.

(10) Patent No.: US 8,924,637 B2
(45) Date of Patent: Dec. 30, 2014

(54) FLASH MEMORY STORAGE SYSTEM

(71) Applicant: Hitachi, Ltd, Tokyo (JP)

(72) Inventors: Takashige Iwamura, Yokohama (JP);
Kazuhisa Fujimoto, Koganei (JP);
Yoshiaki Eguchi, Yokohama (JP);
Shunji Kawamura, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 5 days.

(21) Appl. No.: 13/716,326

(22) Filed: Dec. 17, 2012

(65) Prior Publication Data

US 2013/0103895 A1    Apr. 25, 2013

Related U.S. Application Data

(63) Continuation of application No. 13/414,755, filed on Mar. 8, 2012, now Pat. No. 8,359,426, which is a continuation of application No. 13/010,897, filed on Jan. 21, 2011, now Pat. No. 8,166,235, which is a continuation of application No. 12/617,765, filed on Nov. 13, 2009, now Pat. No. 7,899,981, which is a continuation of application No. 11/503,217, filed on Aug. 14, 2006, now Pat. No. 7,640,390.

(30) Foreign Application Priority Data

May 31, 2006    (JP) ................. 2006-150912

(51) Int. Cl.
*G06F 12/00* (2006.01)
*G06F 12/02* (2006.01)
*G11C 16/34* (2006.01)

(52) U.S. Cl.
CPC ......... *G06F 12/0246* (2013.01); *G11C 16/349* (2013.01)
USPC ....................................... 711/103

(58) Field of Classification Search
None
See application file for complete search history.

(56) References Cited

U.S. PATENT DOCUMENTS

| 5,680,579 | A | 10/1997 | Young et al. |
| 5,696,934 | A | 12/1997 | Jacobson et al. |
| 5,737,742 | A | 4/1998 | Achiwa et al. |
| 5,920,884 | A | 7/1999 | Jennings, III et al. |
| 5,956,743 | A | 9/1999 | Bruce et al. |
| 6,119,245 | A | 9/2000 | Hiratsuka |

(Continued)

FOREIGN PATENT DOCUMENTS

| CN | 1147933 C | 4/2004 |
| JP | 8235076 | 9/1996 |

(Continued)

OTHER PUBLICATIONS

Rossi et al., "Fast and Compact Error Correcting Scheme for Reliable Multilevel Flash Memories", © 2002 IEEE, p. 1-5.

(Continued)

*Primary Examiner* — Brian Peugh
(74) *Attorney, Agent, or Firm* — Mattingly & Malur, PC

(57) ABSTRACT

A flash memory storage system has a plurality of flash memory devices comprising a plurality of flash memories, and a controller having an I/O processing control unit for accessing a flash memory device specified by a designated access destination in an I/O request received from an external device from among the plurality of flash memory devices. A parity group can be configured of flash memory devices having identical internal configuration.

6 Claims, 19 Drawing Sheets

(56) References Cited

U.S. PATENT DOCUMENTS

| | | |
|---|---|---|
| 6,519,185 B2 | 2/2003 | Harari et al. |
| 6,598,114 B2 | 7/2003 | Funakoshi |
| 6,622,200 B1 | 9/2003 | Hasbun et al. |
| 7,047,354 B2 | 5/2006 | Yagisawa et al. |
| 7,409,492 B2 | 8/2008 | Tanaka et al. |
| 7,464,221 B2 | 12/2008 | Nakamura et al. |
| 7,631,245 B2 * | 12/2009 | Lasser ............ 714/768 |
| 7,640,390 B2 | 12/2009 | Iwamura et al. |
| 7,899,981 B2 | 3/2011 | Iwamura et al. |
| 8,166,235 B2 | 4/2012 | Iwamura et al. |
| 8,359,426 B2 * | 1/2013 | Iwamura et al. ........ 711/103 |
| 2002/0129192 A1 | 9/2002 | Spiegel et al. |
| 2005/0021905 A1 * | 1/2005 | Kwon ............ 711/103 |
| 2005/0081087 A1 | 4/2005 | Yagisawa et al. |
| 2005/0268057 A1 | 12/2005 | Satoyama et al. |
| 2006/0059408 A1 | 3/2006 | Chikusa et al. |
| 2007/0283079 A1 | 12/2007 | Iwamura et al. |
| 2008/0010398 A1 | 1/2008 | Jiang |
| 2008/0098158 A1 | 4/2008 | Kitahara |
| 2009/0043961 A1 | 2/2009 | Nakamura et al. |
| 2010/0064097 A1 | 3/2010 | Iwamura et al. |
| 2011/0119435 A1 | 5/2011 | Iwamura et al. |
| 2012/0173802 A1 | 7/2012 | Iwamura et al. |

FOREIGN PATENT DOCUMENTS

| | | |
|---|---|---|
| JP | 20000207137 | 7/2000 |
| JP | 2001290681 | 10/2001 |
| JP | 3507132 | 12/2003 |
| JP | 2005181185 | 1/2005 |
| JP | 200618419 | 1/2006 |
| JP | 2006048559 | 2/2006 |
| JP | 200679380 | 3/2006 |

OTHER PUBLICATIONS

European Search Report dated Jun. 15, 2010 for corresponding European Patent Application No. 06 25 6191.

Chang, et al., "Multi-level Memory Systems using Error Control Codes", © 2004 IEEE, p. 393-396.

* cited by examiner

| FMD-ID | BLOCKAGE FLAG | WWN | LUN | MODEL NUMBER | CAPACITY | NUMBER OF FMP | BLOCK SIZE |
|---|---|---|---|---|---|---|---|
| 1 | NO | AA.. | 0 | A-Type1 | 40GB | 30 | 8KB |
| 2 | NO | BB.. | 0 | A-Type1 | 40GB | 30 | 8KB |
| 3 | NO | CC.. | 0 | A-Type2 | 40GB | 20 | 8KB |
| 4 | NO | DD.. | 0 | B-Type2 | 80GB | 30 | 16KB |
| 5 | NO | EE.. | 0 | B-Type2 | 80GB | 30 | 16KB |
| ... | | .. | .. | .. | .. | .. | .. |

| PG-ID | BLOCKAGE FLAG | RAID LEVEL | NUMBER OF FMD | ENTRY FMD-ID |
|---|---|---|---|---|
| 1 | NO | 1 | 2 | 1, 2 |
| 2 | NO | 1 | 4 | 3, 4, 6, 7 |
| 3 | NO | 5 | 5 | .. |
| 4 | YES | 5 | 4 | .. |
| ... | .. | .. | .. | .. |

| INTERNAL LU-ID | BLOCKAGE FLAG | PG-ID | START ADDRESS | END ADDRESS | BLOCK SIZE | COMPARE FLAG |
|---|---|---|---|---|---|---|
| 1 | NO | 1 | 1 | 500000 | 8KB | NO |
| 2 | NO | 1 | 500001 | 1000000 | 512KB | NO |
| 3 | NO | 1 | 1000001 | 1500000 | 16KB | YES |
| 4 | YES | 2 | 1 | 1000000 | 16KB | NO |
| 5 | NO | 2 | 1000001 | 2000000 | 16KB | NO |
| ... | .. | .. | .. | .. | .. | .. |

FIG. 10
(0) INITIAL STATE (BLOCK 0, 1 STAGING COMPLETED BY READ)
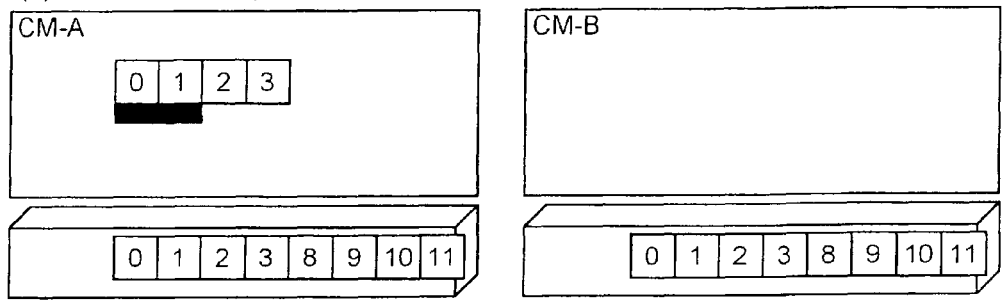
(1) AFTER Write REQUEST ARRIVED TO BLOCK 2 AND Ack IS RETURNED
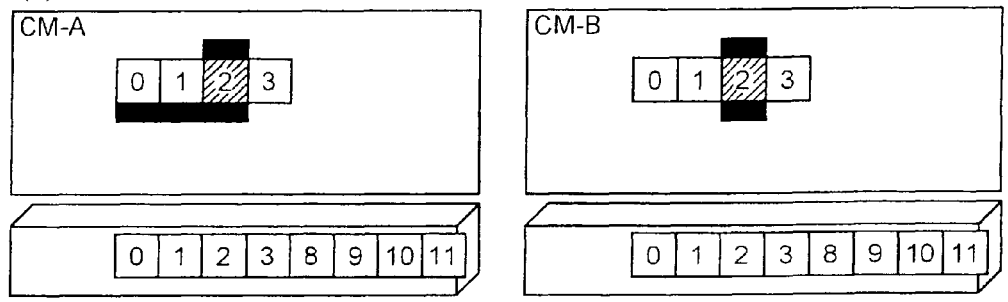
(2) TRANSITION TO FMD UNIT BLOCK
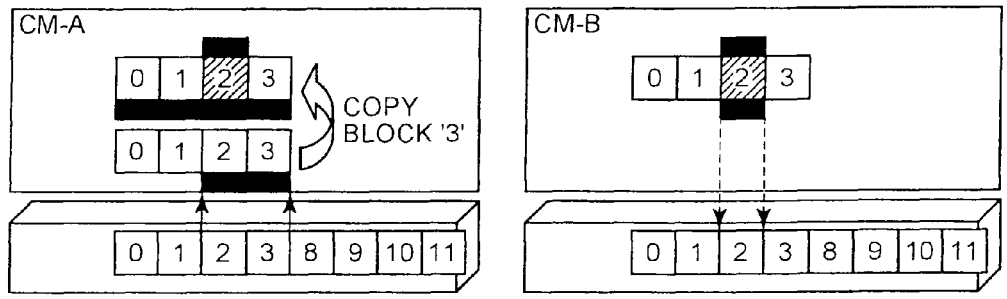
(3) DESTAGING
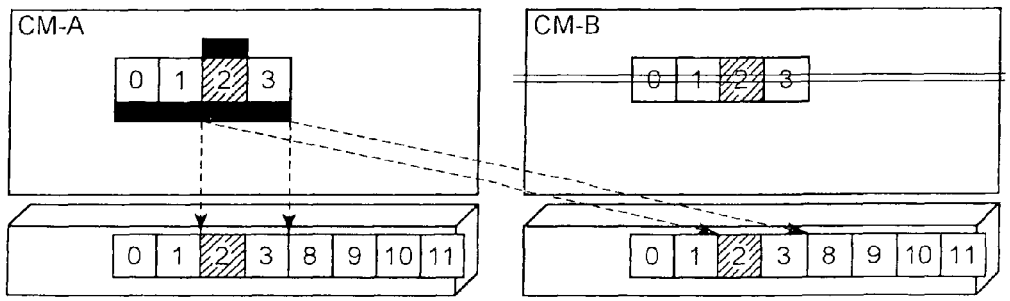

FIG. 11
(0) INITIAL STATE (BLOCK 0, 1 STAGING COMPLETED BY READ)
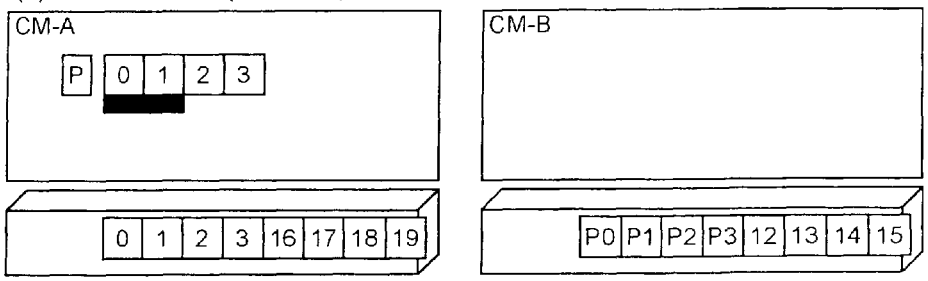
(1) AFTER Write REQUEST ARRIVED TO BLOCK 2 AND Ack IS RETURNED
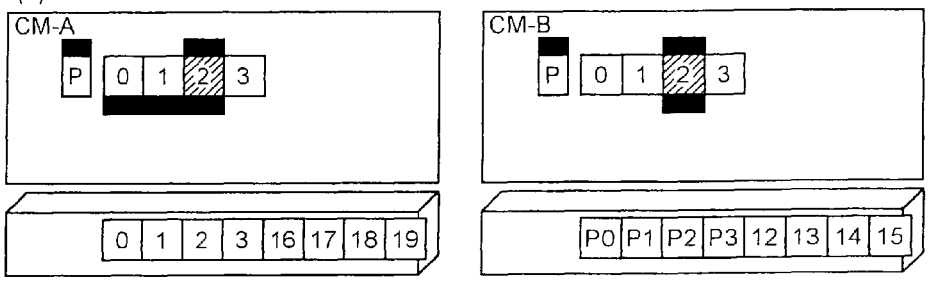
(2) OLD DATA AND OLD PARITY ARE READ OUT AND TRANSITION IS MADE TO FMD UNIT BLOCK
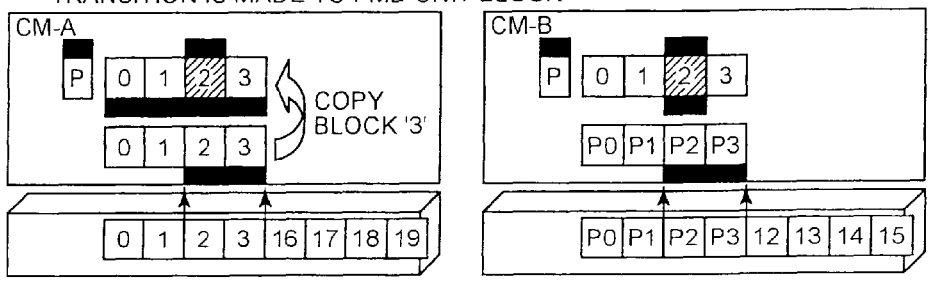
(3) AFTER PARITY IS CREATED ON CACHE
(NEW PARITY = XOR (NEW DATA, OLD DATA, OLD PARITY))
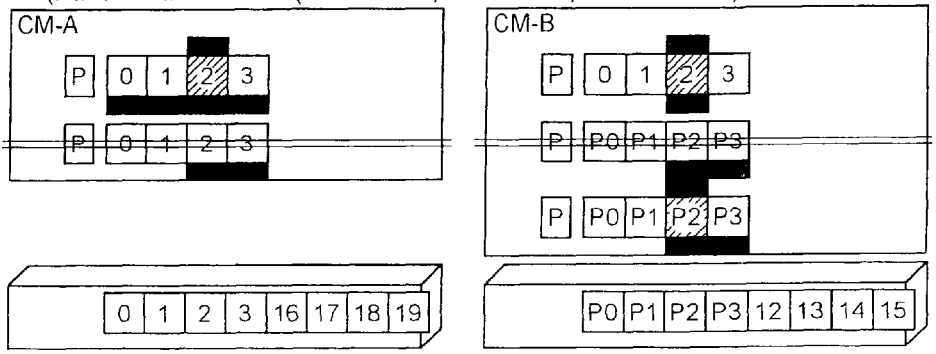

FIG. 12
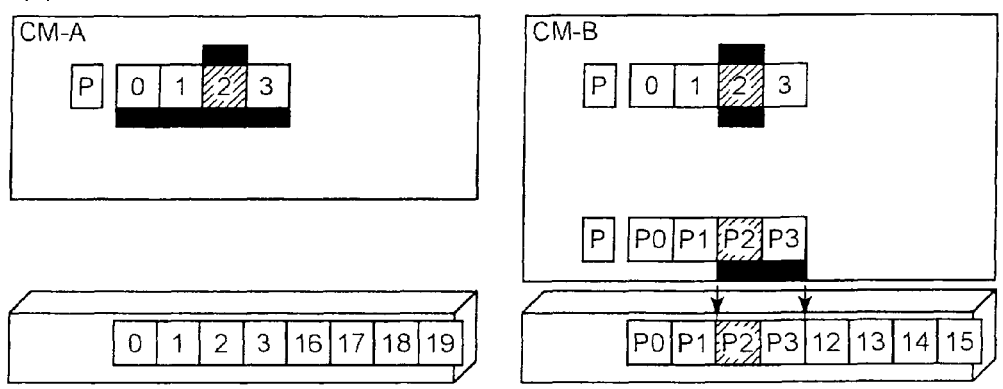
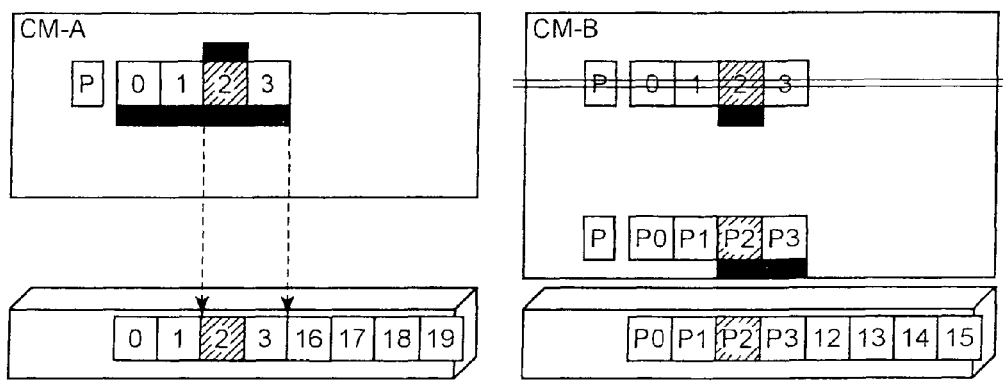

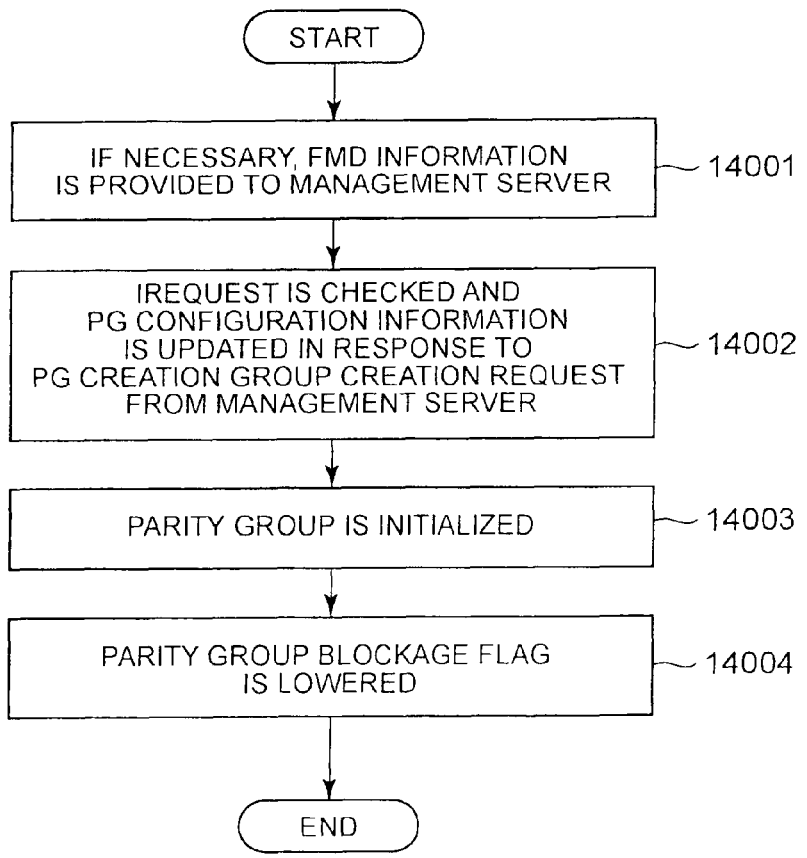

FLASH MEMORY STORAGE SYSTEM

CROSS-REFERENCE TO PRIOR APPLICATION

This application is a continuation of application Ser. No. 13/414,755, filed Mar. 8, 2012, now U.S. Pat. No. 8,359,426; which is a continuation of application Ser. No. 13/010,897, filed Jan. 21, 2001, now U.S. Pat. No. 8,166,235; which is a continuation of application Ser. No. 12/617,765, filed Nov. 13, 2009, now U.S. Pat. No. 7,899,981; which is a continuation of application Ser. No. 11/503,217, filed on Aug. 14, 2006, now U.S. Pat. No. 7,640,390; which relates to and claims priority from Japanese Patent Application No. 2006-150912, filed on May 31, 2006 and, the entire disclosures of which are incorporated herein by reference.

BACKGROUND OF THE INVENTION

1. Field of the Invention

The present invention relates to a storage system comprising a plurality of storage devices.

2. Description of the Related Art

An information system is generally equipped with a storage system using a HDD (Hard Disk Drive) as a storage device, and such storage system is accessed from a plurality of higher-level devices (for example, hosts) via a storage area network (SAN). Storage control in the storage system is conducted according to a RAID (Redundant Array of Independent (or Inexpensive)) technology. As a result, a highly reliable information system can be realized.

On the other hand, since the bit cost of flash memories has been decreasing in recent years, flash memories have become effective storage devices. Japanese Patent No. 3507132 discloses measures against write failure caused by the increase in the number of rewrite cycles, which is a drawback of flash memory.

A storage system can be considered in which a flash memory is installed instead of or in addition to a HDD and data that will be read out or written into a higher-level device are stored in the flash memory. It can be anticipated that a storage system having the same storage capacity as a storage system based on a plurality of HDD will be realized by providing a large number of flash memories.

Though Japanese Patent No. 3507132 discloses measures against the increase in the number of rewrite cycles, which is a drawback of flash memory, no measures against a signal component failure (blockage) is disclosed. Such a measure being absent, data stored in a flash memory can be volatilized by a single component failure and, therefore, reliability of storage system cannot be increased even if a storage system comprising a plurality of flash memories can be increased in capacity.

SUMMARY OF THE INVENTION

It is an object of the present invention to increase reliability of a high-capacity storage system comprising a plurality of flash memories.

A flash memory storage system in accordance with the present invention is a storage system for receiving and processing an I/O request from an external device, comprising a plurality of flash memory devices (FMD) comprising a plurality of flash memories, and a controller having an I/O processing control unit for accessing an FMD specified by a designated access destination in the received I/O request, from among a plurality of the FMD.

In the first embodiment, two or more parity groups configured of two or more FMD from among a plurality of the FMD can be present. FMD with different internal configurations may be contained in a plurality of the FMD. Each parity group can be configured of FMD with identical internal configuration.

In the second embodiment, in the flash memory storage system of the first embodiment, the internal configuration can be at least one from among (1) through (3) below:
(1) the number of flash memories provided in the FMD;
(2) a block size employed by the FMD;
(3) the total storage capacity of a plurality of flash memories provided in the FMD.

In the third embodiment, in the flash memory storage system of the first embodiment, a plurality of FMD types including at least one FMD type from among a first type, a second type, and a third type can be present as the internal configuration. The first FMD, which is an FMD of the first FMD type, can comprise a plurality of flash memories and an internal controller having a first FMD control unit for controlling input and output to and from a plurality of the flash memories. When the FMD is the first FMD, the first FMD control unit can control the input and output according to an access from the I/O processing control unit. A second FMD, which is an FMD of the second FMD type, comprises a plurality of the first FMD and a second FMD control unit for controlling access to the plurality of first FMD according to an access from the I/O processing control unit. Each of the plurality of first FMD is recognized by the controller. The first FMD control unit of each first FMD can control the input and output according to an access from the second FMD control unit. A third FMD, which is an FMD of the third type, can comprise a plurality of the first FMD and a third FMD control unit for controlling access to the plurality of first FMD according to an access from the I/O processing control unit. The plurality of FMD are recognized as one device by the controller. The first FMD control unit of each first FMD controls the input and output according to an access from the third FMD control unit.

In the fourth embodiment, in the flash memory storage system of the third embodiment, the internal configuration further demonstrates at least one performance from among those of the internal controller, the second FMD control unit, and the third FMD control unit.

In the fifth embodiment, an FMD that differs by a vendor and/or production data may be included in the plurality of FMD.

In the sixth embodiment, in the flash memory storage system of the first embodiment, one or a plurality of disk-type storage devices may be present in addition to the plurality of FMD. The configuration can be such that none of the one or a plurality of disk-type storage devices is present in the parity group comprising the FMD.

In the seventh embodiment, each FMD can detect insufficiency of free storage capacity thereof and can further comprise an information notification unit for sending a predetermined message when the insufficiency is detected. The controller can execute control in response to the predetermined message.

In the eight embodiment, in the flash memory storage system of the first embodiment, the controller can further comprise a configuration control unit. When the configuration control unit detects that any one FMD from among the plurality of FMD has been blocked, the configuration control unit specifies a parity group to which the blocked FMD belongs, searches for another FMD compatible with the parity group, recovers data located in the blocked FMD, and writes the recovered data into the found another FMD.

In the ninth embodiment, at least one of the two or more parity groups can be configured of two or more second FMD. The second FMD can comprise a plurality of first FMD and a second FMD control unit for controlling access to the plurality of first FMD according to an access from the I/O processing control unit. Each of the plurality of first FMD is recognized by the controller. The first FMD can comprise a plurality of flash memories and an internal controller having a first FMD control unit for controlling input to and output from the plurality of flash memories. The first FMD control unit of each first FMD controls the input and output according to the access from the second FMD control unit.

In the tenth embodiment, in the flash memory storage system of the ninth embodiment, the controller can manage the presence and absence of a failure in the first FMD units with respect to a parity group configured of the two or more second FMD.

In the eleventh embodiment, in the flash memory storage system of the ninth embodiment, the parity group configured of the two or more second FMD can comprise a plurality of sub-parity groups. Each sub-parity group can be configured of two or more first FMD in at least one of the two or more second FMD. At least one logical storage unit is provided by the each sub-parity group. Even when data present in a sub-parity group from among the plurality of sub-parity groups cannot be restored, if another sub-parity group in which no failure has occurred is present from among the plurality of sub-parity groups, the I/O processing control unit can perform input and output, without blocking a storage unit present on the other sub-parity group.

In the twelfth embodiment, in the flash memory storage system of the ninth embodiment, the parity group configured of the two or more second FMD can comprise a plurality of sub-parity groups. Each sub-parity group can be configured of first FMD present in respectively different second FMD from among the two or more second FMD.

In the thirteenth embodiment, in the flash memory storage system of the ninth embodiment, at least one second FMD can comprise a spare first FMD that does not belong to a parity group. The controller can comprise a configuration control unit. Where a need has arisen in a certain second FMD, the configuration control unit can use the spare first FMD present in the second FMD.

In the fourteenth embodiment, in the flash memory storage system of the thirteenth embodiment, when the spare first FMD is not present in the second FMD where a need has arisen, the configuration control unit can use the spare first FMD present in another second FMD.

In the fifteenth embodiment, in the flash memory storage system of the thirteenth embodiment, when the spare first FMD is not present in the second FMD where a need has arisen, the configuration control unit searches a separate second FMD compatible with a parity group to which the second FMD belongs, writes data present in the second FMD into the separate second FMD, and blocks the second FMD.

In the sixteenth embodiment, the controller can comprise a configuration control unit. The configuration control unit can check whether or not the internal configurations of a plurality of FMD designated from the external device as configuration elements of a parity group are identical and outputs an alarm to the external device when the internal configurations are not identical.

In the seventeenth embodiment, a plurality of logical storage units are provided by the plurality of FMD and a block size of each storage unit is less than a block size of each FMD.

In the eighteenth embodiment, the flash memory storage system can further comprise a cache memory. When the I/O request is a read request, the I/O processing control unit can read data from the plurality of FMD according to the read request, temporarily accumulate the data that have been read out in the cache memory, then send the data accumulated in the cache memory to the external device, and check the correctness of data that are accumulated in the cache memory when the data that have been read out are accumulated in the cache memory.

In the nineteenth embodiment, a plurality of address spaces can be hierarchized. Block sizes in each layer can be made different. A flash memory, an FMD, a parity group configured of two or more FMD, and a logical storage unit to be provided to the external device are present as a layer.

In the twentieth embodiment, the FMD can have an I/O interface compatible with the disk interface.

In the twenty first embodiment, the FMD can comprise an internal controller having an FMD control unit for controlling an input and output with respect to each flash memory. When the FMD control unit writes data into a flash memory, the data can be written into a flash memory other than the flash memory in which data were recently written. Furthermore, in this case, with the FMD control unit a block prior to updating in the flash memory can be taken as a free area. Furthermore, in order to enable writing of the block taken as a free area with an erase command, the FMD control unit can move the block data in segment units where a plurality of blocks were collected and execute the erase command by taking the entire segment as a free area.

Each of the above-described "units" can be also termed "means". Each unit or each means can be implemented with hardware (for example, a circuit), a computer program, or a combination thereof (for example, one or a plurality of CPU executed by reading a computer program). Each computer program can be read from a storage source provided in the computer machine (for example, a memory). In the storage source, installation can be conducted via a storage medium such as a CD-ROM or DVD (Digital Versatile Disk), and downloading can be conducted via a communication network such as internet or LAN.

Furthermore, at least one of the above-described controller and internal controller can be configured of one or a plurality of hardware sources. More specifically, it can be configured, for example, of one or a plurality of circuit boards.

BRIEF DESCRIPTION OF THE INVENTION

FIG. 5 shows a configuration example of FMD information 4050 saved with the controller 1010;

FIG. 6 shows a configuration example of the PG configuration information 4060;

FIG. 7 shows a configuration example of the internal LU configuration information 4070;

FIG. 10 shows an example of using a cache in the address space shown in FIG. 8;

FIG. 11 shows part of an example of using a cache in the address space shown in FIG. 9;

FIG. 12 shows remaining part of an example of using a cache in the address space shown in FIG. 9;

FIG. 13 shows a configuration example of the LU path definition information 4080;

FIG. 14 is a flowchart illustrating the definition processing of a parity group executed in the configuration control program 4030;

DETAILED DESCRIPTION OF THE PREFERRED EMBODIMENTS

Embodiments of the present invention will be explained below with reference to the appended drawings.

<1. Configuration of Information System>

Figure 1:
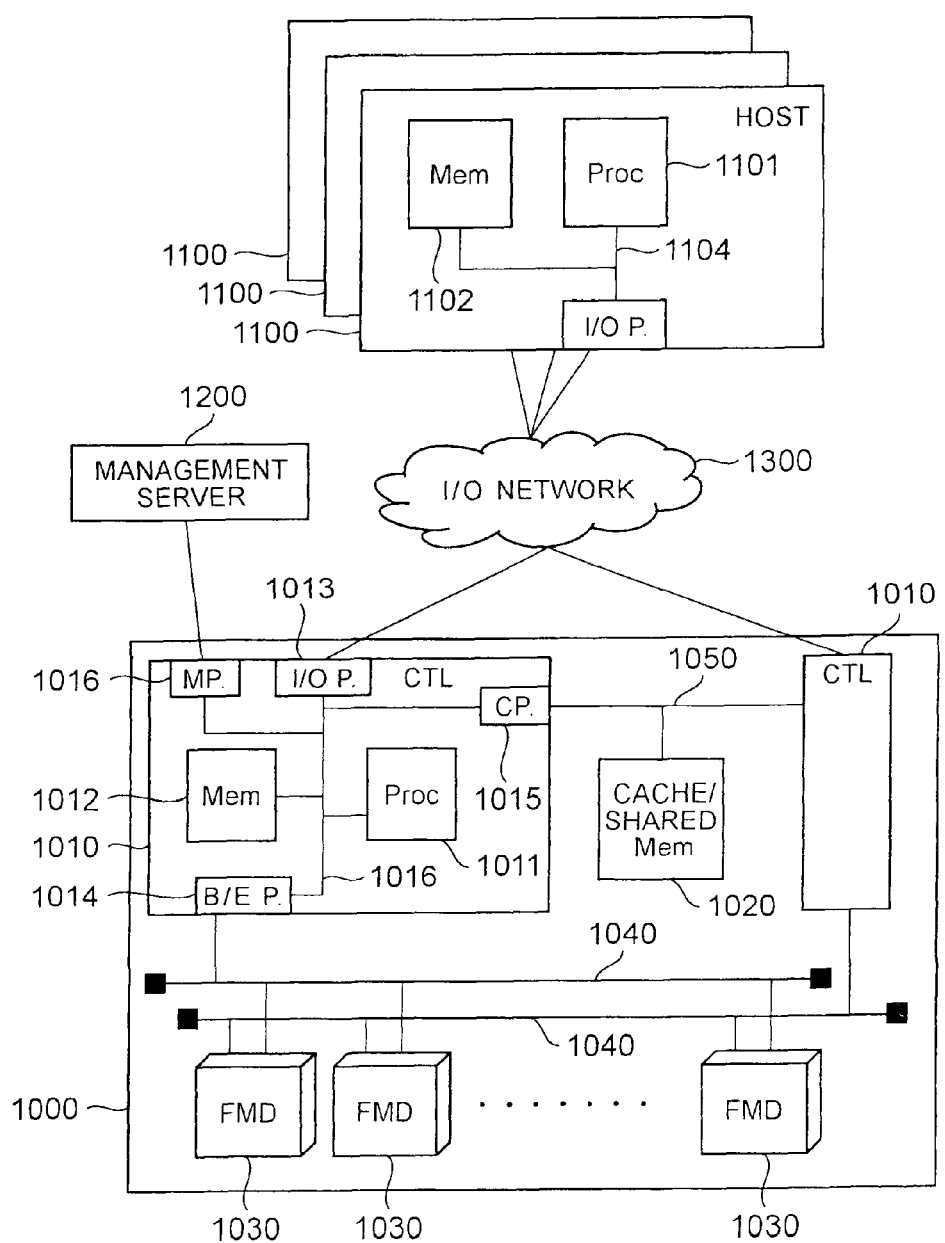
FIG. 1 shows an example of a hardware configuration of the information system of one embodiment of the present invention.

FIG. 1 illustrates an example of hardware configuration of an information system of one embodiment of the present invention.

The information system comprises, for example, a storage system 1000, a host computer (abbreviated hereinbelow as "host") 1100, and a management server 1200. The number of storage systems 1000, hosts 1100, and management servers 1200 can be more than one each. The storage system 1000 and host 1100 are connected to each other via an I/O network 1300. The storage system 1000 and management server 1200 are connected to each other via a management network (not shown in the figure) or the I/O network 1300.

The host 1100 has an internal network 1104, and a processor (abbreviated in the figure as "Proc") 1101, a memory (abbreviated in the figure as "Mem") 1102, and an I/O port (abbreviated in the figure as "I/OP") 1103 are connected to the network 1104. The management server 1200 also can have a hardware configuration identical to that of the host 1100.

The management server 1200 has a display device, and screens for managing the storage system 1000 can be displayed on the display device. Furthermore, the management server 1200 can receive a management operation request from a user (for example, an operator of the management server 1200) and send the received management operation request to the storage system 1000. The management operation request is a request for operating the storage system 1000 and can be, for example, a parity group creation request, an internal LU creation request, and a path definition request. Each of those request is described below.

Connection via a fiber channel is a primary candidate for the I/O network 1300, but a combination of FICON (Fiber CONnection: trade name), Ethernet (trade name), TCP/IP, and iSCSI or a combination of network file systems such as Ethernet, NFS (Network File System), and CIFS (Common Internet File System) can be also considered. Furthermore, the I/O network 1300 may be of any type, provided that it is a communication device capable of transferring I/O requests.

The storage system 1000 comprises a controller (represented by CTL in the FIG. 1010, a cache memory (represented by Cache/Shared Mem in the FIG. 1020, and a plurality of flash memory devices (sometimes abbreviated hereinbelow as "FMD") 1030. In the preferred embodiment, the controller 1010 and cache memory 1020 are composed of a plurality of components. This is because even when failure has occurred in a unit component and the component is blocked, the I/O requests represented by read or write request still can be continuously received by using the remaining components.

The controller 1010 is a device (for example, a circuit board) for controlling the operation of the storage system 1000. The controller 1010 has an internal network 1016. An I/O port 1013, a cache port (represented by CP in the FIG. 1015, a management port (represented by MP in the FIG. 1016, a backend port (represented by B/EP in the FIG. 1014, a processor (for example, a CPU) 1011, and a memory 1012 are connected to the network 1016. The controller 1010 and cache memory 1020 are connected to each other with a storage internal network 1050. Furthermore, the controller 1010 and each FMD 1030 are connected to each other with a plurality of backend networks 1040.

The networks located inside the host 1100 and storage system 1000 preferably have bands wider than the transfer band of the I/O port 1013 and may be partially or entirely replaced with a bus or switch-type network. Furthermore, in the configuration shown in FIG. 1, one I/O port 1013 is present in the controller 1010, but actually a plurality of I/O ports 1013 may be present in the controller 1010.

The above-described hardware configuration enables the host 1100 to read or write some or all data saved in FMD 1030 of the storage system 1000.

Figure 4:
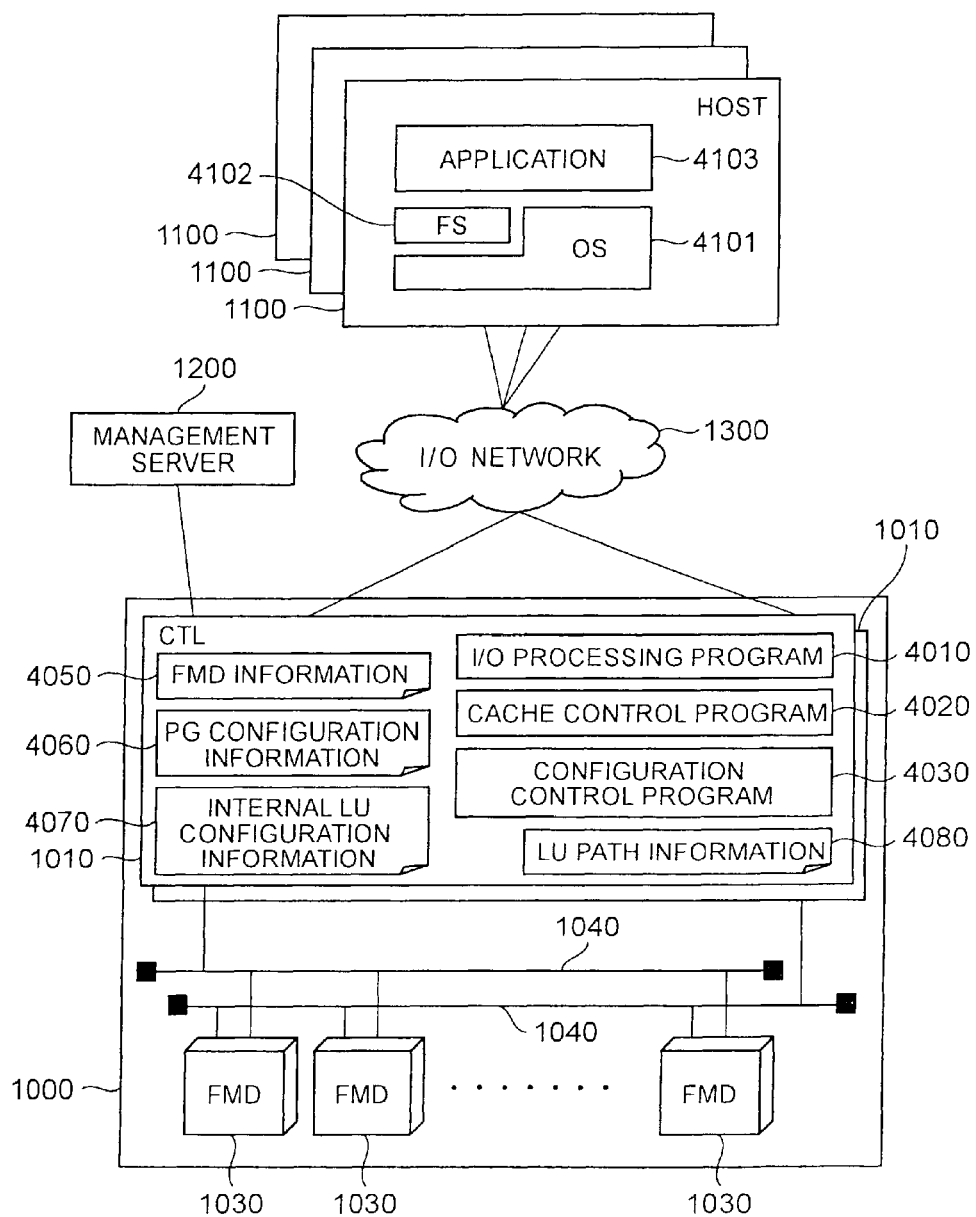
FIG. 4 shows computer programs and information present in the host 1100 and storage system 1000.

FIG. 4 shows computer program and information present in the host 1100 and storage system 1000.

In the controller 1010, FMD information 4050, PG configuration information 4060, internal LU configuration information 4070, and LU path information 4080 are held by at least one of the processor 1011, memory 1012, I/O port 1013, backend port 1014, and cache port 1015 in the controller 1010, and the controller executes an I/O processing program 4010, a cache control program 4020, and a configuration control program 4030. The entire information held in the controller 1010 or part thereof may be held in an area (for example, part of FMD 1030 or cache memory 1020) outside the controller 1010 inside the storage system 1000.

When a program is the subject in the following description, the program of subject will be executed by a processor.

The I/O processing program 4010 receives an I/O request (for example, a read command or a write command) from the host 1100 and executes processing according to this I/O request. More specifically, for example, the I/O processing program 4010 transfers the data saved in the cache memory 1020 (read object data corresponding to the read command) to the host 1100 and saves the data received from the host 1100 (write object data corresponding to the write command) in the cache memory 1020. When the I/O request from the host 1100 is in a block access format, the I/O processing program 4010 also can perform processing for providing a logical volume (for example, a Logical Unit (LU) in SCSI) that will be the access object. Furthermore, when the I/O request from the host 1100 is in a file format, the I/O processing program 4010 can perform processing for providing a file or directory that will be the access object. The I/O processing program 4010 may also perform processing for providing access for other I/O requests (for example, database query or I/O request in a CKD format).

The cache control memory 4020 can copy (including moving), together with the I/O processing program 4010 or independently therefrom, the data saved by the FMD 1030 to the cache memory 1020 and copy the data saved by the cache memory 1020 to the FMD 1030. The cache control program 4020 may further perform the processing of producing and/or updating the redundancy data represented by RAID from the data saved in the cache memory 1020, as a processing for improving reliability.

The configuration information program 4030 can perform the processing of referring and/or updating at least one information of the FMD information 4050, PG configuration information 4060, internal LU configuration information 4070, and LU path information 4080 in response to a configuration change and/or configuration reference request. The configuration change and/or configuration reference request can be issued, for example, from at least one from among the management server 1200, host 1100, and other computers.

The FMD information 4050 includes information relating to FMD 1030. The PG configuration information 4060 includes parity group (sometimes abbreviated as PG hereinbelow) configuration information. The internal LU configuration information 4030 includes information for configuring some or all the areas of the FMD contained in the parity group as an internal logical unit (abbreviated hereinbelow as "internal LU"). The LU path information includes information representing the correspondence relationship between the internal LU and the LU provided by the I/O port 1013 to the host 1100. In the explanation below, the case will be mainly described in which the internal LU corresponds to an area of one parity groups, but the present invention is not limited to this case. The internal LU may be also configured by concatenating or striping from areas of a plurality of parity groups.

In the host 1100, at least one of an OS 4101, a file system 4102, and application program (abbreviated hereinbelow as "application") 4103 is executed by at least one of the processor 1101, memory 1102, and I/O port 1103.

The application 4103 is a program (for example, a Web server program or database management program) for performing business processing in response to a request from a user or another computer, while reading and writing data such as files, by relying upon the OS 4101 or file system 4102.

The OS 4101 can send an I/O request issued by the application 4103 or file system 4102 to the I/O port 1013 of the storage system 1000 or receive data from the storage system 1000. The file system 4102 can convert the I/O request in the file format from the application to an I/O request in a block format or an I/O request in an network file system protocol format and request the transfer of the I/O request to the OS 4101.

The host 1100 may also execute other programs. Furthermore, the host 1100 may also send and receive a request other than the block I/O request or file I/O request, for example, a database query or CKD-type request. Moreover, the entire processing of the program including a file system or OS executable by the host 1100 or controller 1010, or part of the processing, may be implemented by the hardware.

<2. Overview of the Present Embodiment>

A flash memory (sometimes abbreviated hereinbelow as "FM") is a block-type storage device suitable for random access because it does not involve a head seek or a rotation wait, by contrast with a HDD. However, in a package unit (includes forms when the FM is supplied as semiconductor component; sometimes termed hereinbelow as "FM package"), a flash memory has a data capacity or physical size lower than that of a HDD. For this reason, where a HDD can be replaced by a technician or user by pulling out the HDD by hand, when a flash memory is wished to be replaced in a package unit, the replacement has to be conducted with a special tool such as pincers and is apparently impractical. For this reason, it is necessary to reconsider the FM package arrangement method to enable the replacement of the entire FM package of the storage system 1000.

Accordingly, in the present embodiment a plurality of flash memory packages (sometime abbreviated hereinbelow as "FMP") are combined in one module. This module is an FMD 1030. The FMD 1030 is a single maintenance component in which both the data capacity and physical size are increased with respect to those of one FM package. The FMD 1030 preferably has an I/O interface replaceable with a HDD interface, and it is also preferred that by providing the shape that can be incorporated into the location where a HDD has been incorporated, some or all operations necessary for maintaining the storage system can be conducted in the same manner as those of HDD.

Furthermore, in the present embodiment, in order to avoid loosing data due to a failure occurring in the FMD 1030 and to improve the I/O performance, the parity group is configured of more than one FMD (preferably, a plurality thereof).

In this case, where a parity group is configured of FMD 1030 that differ one from another significantly in terms of I/O performance (for example, response time, transfer band, IOPS (processing number of I/O requests per 1 sec)), even though the parity group is provided as one LU to the host 1100, the I/O performance can be changed depending on the address to be accessed based on the I/O request. In storage systems carrying a HDD, for example, a method of configuring a parity group of HDDs with identical or close I/O performance can be used to avoid the variation of I/O performance. In order to implement such method, a parity group is configured, for example, by using HDDs that are identical or close to each other in type (for example, model number of support interface) and by using HDDs with identical or close performance (for example, the rotation speed or head movement time).

However, because an FMD is a storage device configured of semiconductors, there is no rotation speed or head movement time.

Accordingly, in the present embodiment, the number of flash memory packages contained in the FMD is used as such performance-related parameter. This is because the limiting performance of the I/O port of the FMD 1030 is higher than the limiting performance of the FMP unit and, therefore, the FMD 1030 with a high FMP number tends to have a higher I/O performance.

Figure 3:
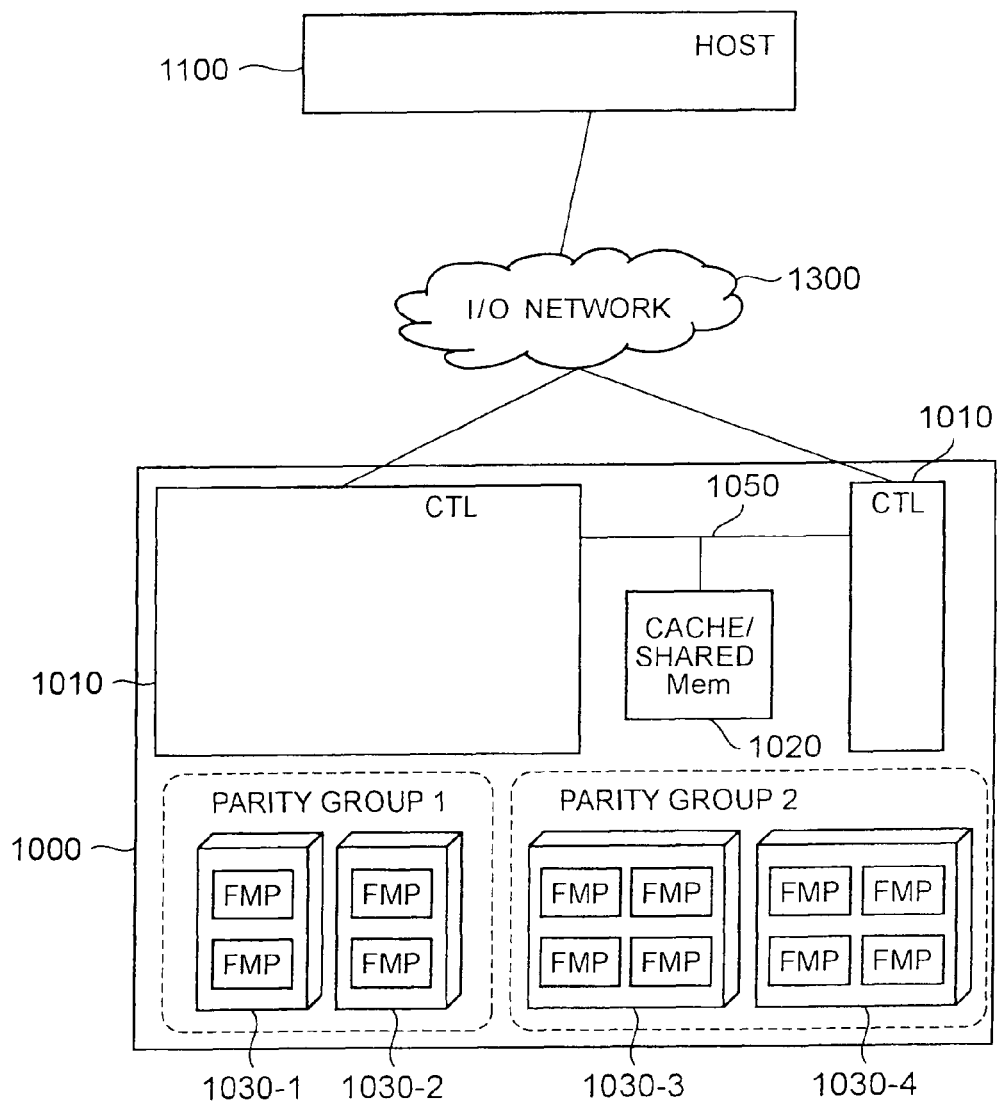
FIG. 3 illustrates an overview of the present embodiment.

FIG. 3 illustrates an overview of the present embodiment.

A case where four FMD 1030-1 through 1030-4 of identical capacity are provided in the storage system 1000 will be considered. Here, the FMD 1030-1 and FMD 1030-2 have two FMP inside thereof, and the FMD 1030-3 to FMD 1030-4 have four FMP inside thereof.

When the controller 1010 defines a parity group configuration, it creates parity groups as sets of FMD having the same number of FMP, as parity groups 1, 2 shown in the figure, by acquiring information (hereinbelow FMD configuration information, for example, the number of FMP or model number thereof) relating to the configuration of FMD from the respective FMD. The controller 1010 can further provide a partial area of the parity group as a logical unit to the host. An access from the host to this logical unit can thereby be accepted.

In the storage system 1000, memory hierarchy can be created by the configuration of the parity group 1 and parity group 2. As for the proper use in this case, the controller 1010 or host 1100 may perform control so that data with a high update frequency be stored in the parity group 2 with a large number of FMP, whereas data with a lower update frequency be stored in the parity group 1 with a small number of FMP.

The number of FMP in each FMD 1030 installed in one storage system 1000 may be the same, but for the reasons described hereinbelow, in most cases, FMD 1030 having different numbers of FMP are mixed in one storage system 1000.

(Reason 1 for Mixing) The storage system 1000 is generally a large-scale system. For example, in a large-scale enterprise storage, a large number of FMD have to be installed. Therefore, FMDs that differ in internal configuration are used together.

(Reason 2 for Mixing) Production capacities of each FMP vendor are different. In this case, because the storage capacity that can be incorporated in an FMD differs between the vendors, even though the FMDs of the same capacity are manufactured, the numbers of FMP installed in one FMD are different. For this reason, when an FMD replacement operation is conducted as a maintenance operation, if devices of the same capacity supplied from different vendors are used, the numbers of FMP can be different and the performance can change.

(Reason 3 for Mixing) There is a difference in FMP production periods. Even if the devices are produced by the same vendor, a storage capacity that can be contained in a FMP differs because of progress in semiconductor technology. Therefore, even when FMDs of the same capacity are supplied from the same vendor, the number of FMP installed in an FMD may be different. As a result, where an FMD replacement operation is conducted as a maintenance operation, when the devices of the same capacity are supplied from the same vendor, the number of FMP differs if the production periods are different. More specifically, for example, in the case where FMD with different production dates are mixed, when maintenance is conducted, the FMD with the oldest production data is sometimes replaced with the FMD of the latest production date that is not present in the storage system.

The storage system 1000 may also have a configuration in which FMD 1030 and HDD are mixed (not shown in the figure). In this case, because I/O characteristics (for example, random access of sequential access, a large number of write requests or a large number of read requests) differ between the HDD and FMD 1030, a parity group can be configured of HDDs and a parity group explained in the present embodiment can be configured with respect to FMD. In other words, a parity group of HDD and a parity group of FMD may be co-present in one storage system 1000.

Furthermore, depending of the direction of technological progress in the future, the performance (for example, processor performance) of controller located in the flash memory package, rather than the number of flash memory packages, can become a bottleneck for the I/O performance of FMD. To resolve this problem, a portion associated with the number of flash memory packages relating to information or processing that is explained hereinbelow may be replaced with the performance of controller located in an FMD. For example, a method can be considered by which the performance of controller inside FMD is provided to the outside and the controller 1010 configures a parity group of FMD with the same (including not only identical, but also close) controller performance inside an FMD.

<3. Detailed Description>
<3.0. Block Size>

Figure 20:
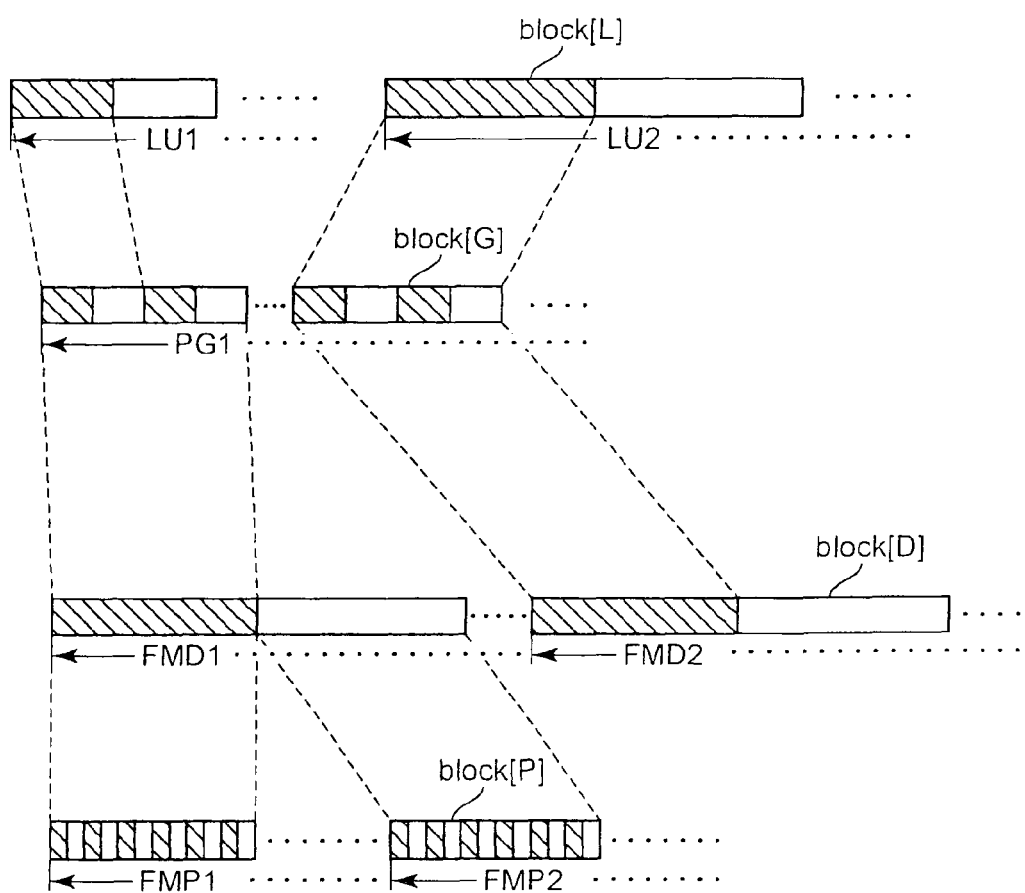
FIG. 20 shows an example of the hierarchical structure of the address space.

A block size in the present embodiment will be described by referring to FIG. 20 prior to a more detailed explanation. In the present embodiment, an address space (more accurately, indicates a device identifier and an address space inside the device) is divided into the below-described four layers and a different block size can be employed in each layer.

(Layer 1) An address space used when FMP is accessed. When this layer is described in the explanation below, a symbol '[P]' is attached to the end of a word.

(Layer 2) An address space used when the FMD 1030 is accessed. The FMD 1030 sometimes employs a block size different form that of the FMP. This is done so because the FMD 1030 comprises a plurality of FMP and in order to avoid the below-described specific feature of flash memory. When this layer is described in the explanation below, a symbol '[D]' is attached to the end of a word.

(Layer 3) An address space allocated to a parity group so that the controller 1010 can manage data on the cache memory 1020. In the present embodiment, the FMD 1030 having various block sizes is assumed to be connected to the controller 1010. Accordingly, in the I/O processing or cache control processing, the controller 1010 can allocate the address space to the parity group with the predetermined block size (for example, 512 byte, which is the minimum block size that is most typical for SCSI) so that such different block sizes may be ignored as completely as possible. For this purpose, block size conversion is performed at the point of time of staging or destaging processing of copying data between the cache memory 1020 and FMD 1030. When this layer is described in the explanation below, a symbol '[G]' is attached to the end of a word.

(Layer 4) An address space used when a LU (or the below-described internal LU) is accessed. Because LU with a block size other than 512 byte is sometimes provided to the host 1100, a block size different from the cache level is employed. When this layer is described in the explanation below, a symbol '[L]' is attached to the end of a word. Each block from layer 1 to layer 4 sometimes includes a redundancy code or data for control (for example, the controller 1010 issues an I/O request so as to save data together with a redundancy code in block [D] of the FMD 1030).

<3.1. FMD>
<3.1.1. Overview>

Figure 2:
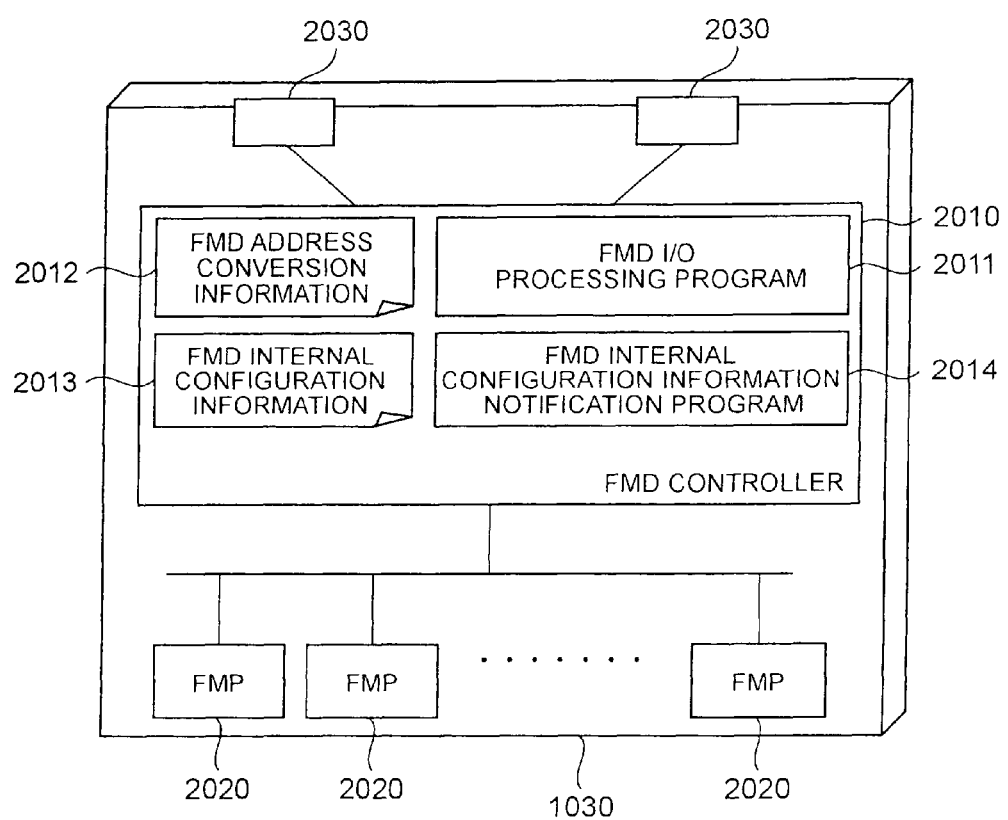
FIG. 2 shows an example of hardware configuration and an example of software configuration of an FMD.

FIG. 2 illustrates an example of hardware configuration and software configuration of an FMD.

The FMD 1030 comprises an I/O port 2030, an FMD controller 2010, and a plurality of FMP 2020. The I/O port 2030 is connected to a backend network 1040 and the FMD controller 2010. The FMD controller 2010 is connected a the plurality of FMP 2020.

Preferably, the FMD 1030 comprises a plurality of I/O ports 2030. This is because due to redundancy of the backend network 1040, connecting each redundantized backend network 1040 with FMD 1030 by independent components is desirable for sustaining the redundancy.

Here, in addition to the above-described specific features, the FMP 2020 has the below-described specific features (A1) through (A4) that are absent in HDD or DRAM (Dynamic Random Access memory).

(A1) An access unit is a block.

(A2) When block data are updated, an erase command for erasing in segment units assembling a plurality of blocks has to be used.

(A3) If update is repeated for the same block, the update processing can fail.

(A4) When the updating some blocks, Data corruption in another blocks sometimes occurs.

In order to perform I/O processing (data updating or reading in response to an I/O request from the controller 1010) that takes those specific features into account, the FMD controller 2010 is equipped, for example, with an FMD I/O processing program 2011, an FMD internal configuration information notification program 2014, an FMD address conversion information 2012, or an FMD internal configuration information 2013. Furthermore, with consideration for the above-described specific features, the FMD 1030 can ensure a extra area by reporting a storage capacity that is less than the total storage capacity of a plurality of FMP 2020 to the controller 1010.

The FMD address conversion information 2012 includes a correspondence relationship of a block address contained in the I/O request received by the FMD controller 2010 and a block of the FMP 2020. For example, the FMD address conversion information 2012 can hold the information of the below described types (B1) and (B2) in each logical block address unit.

(B1) Identifier and address [P] of the FMP that has actually saved the data of address [D].

(B2) Number of time the address [D] has been referred to.

The FMD internal configuration information 2013 is information for monitoring the failure state of each flash memory package and preferably holds the information of the following types (C1) and (C2) in area units where at least one segment located in each FMP 2020 is collected.

(C1) Failure state.

(C2) Erase completed flag.

This information 2013 also holds information for managing a free block and attributes (for example, block size [D], number of blocks [D]) of a storage area (in other words, an address space) provided as FMD to the controller 1010.

The FMD I/O processing program 2011 analyzes the I/O request receives by the FMD controller 2010 via the I/O port 2030 and performs the update of data saved by the FMP 2020 and data transfer to the controller 1010 after the data have been read out from the FMP.

<3.1.2. I/O Processing of FMD>

The processing contents of the FMD I/O processing program 2011 will be described below.

(Step 1) The FMD I/O processing program 2011 receives an I/O request.

(Step 2) When the request is a read request, the FMD I/O processing program 2011 specifies at least one flash memory package 2020 where data have been saved and a block [P] in this package from the start logical block address [D], block length [D] and FMD address conversion information contained in the request, reads data from the specified block [P], returns the data that were read out to the a request transmission source (controller 1010), and returns to Step 1. When the request is a write request, the FMD I/O processing program 2011 executes Step 3 and subsequent steps for each received block data.

(Step 3) The FMD I/O processing program 2011 retrieves a block [P] satisfying all of the following conditions (D1) through (D3) from the FMP next to the FMP 2020 that was used for storing data recently.

(D1) Failure has not occurred.

(D2) Free area.

(D3) Contained in a segment where implementation of erase command has been competed.

The FMP 2020 that was used for storing data recently can be specified, for example, by providing a flag area corresponding to each FMP 2020 installed on the FMD 1030 in the FMD internal configuration information 2013, set a flag (for example, writes "1") in the flag area corresponding to the FMP that was used for storing data recently, and unset the flag (for example, changing "1" to "0") of the flag area corresponding to the FMP that was used for storing data recently before the setting. As another method, specification can be also conducted by saving an identifier of FMP in the controller when the FMD controller 2010 saves data to the FMP. Furthermore, the next FMP can be considered as a FMP with a number by 1 larger than the number of the FMP 2020 where data were saved in the previous cycle.

When the block [P] meeting the above-described conditions cannot be found from this FMP, the FMD I/O processing program 2011 repeats the search from further next FMP.

(Step 4) The FMD I/O processing program 2011 saves all the write data (data of a write object according to the write request) or part thereof with respect to the found block [P]. The program 2011 may also involve processing of one or all types from (E1) and (E2) in combination with the saving processing.

(E1) Prior to saving, a redundancy code such as a LRC (Longitudinal Redundancy Check) or CRC (Cyclic Redundancy Check) is calculated from the write data, and write data are stored together with the redundancy code. This redundancy code is used to check the presence of data corruption when a read request is received. When data corruption has occurred, an error is returned by the read request and the occurrence of block failure is recorded in the FMD internal configuration information 2013.

(E2) After saving, the block data are read from the FMP 2020 and compared. When the comparison fails, the occurrence of a failure in the block is recorded in the FMD internal configuration information 2013 and the processing is restarted again from Step 3.

(Step 5) The FMD I/O processing program 2011 updates the block address [P] and FMP 2020 corresponding to the block address [D] of the address conversion information 2012 so as to indicate a block [P] of the FMP that saved data anew, and the block [P] prior to updating is taken as a free area.

Furthermore, as a separate processing, the FMD I/O processing program 2011 can execute the processing of enabling writing into the block that became a free space anew by an erase command (erase processing). However, because the erase command can be executed only in segment units where a plurality of blocks are collected, a procedure can be considered by which the erase command is executed after the entire segment has been made a free area by block data movement, and after the command execution is completed, an erase completed flag is set in the FMD internal configuration information 2013 (that is, a record is made that the segment has been erased). Such processing can be performed repeatedly in response to the request processing or at an asynchronous timing.

Where some or all the below-described conditions (F1) through (F4) are provided with respect to the above-described erase processing or read or write processing method with consideration for the specific features (A1) through (A4), it may be replaced with another processing.

(F1) Update concentration to the same block in a flash memory package is avoided.

(F2) Erase processing is executed prior to block overwriting in a flash memory package.

(F3) Data transformation accompanied by a redundancy code is detected and repaired.

(F4) Processing to enable the distribution of access to a plurality of flash memory packages is conducted (for example, a method described in Japanese Patent No. 3507132).

<3.1.3. FMD Internal Configuration Information Notification Program>

The FMD internal configuration information notification program 2014 is a program for notifying the controller 1010 or the like of the internal information of the FMD. An example of information provided by the program 2014 is shown in (G1) through (G8) below.

(G1) Block size [D] of the FMD 1030 (the controller 1010 performs access in block size units).

(G2) The number of usable blocks [D] of FMD (the controller 1010 sometimes knows the usable storage capacity from the number of blocks and block size [D]).

(G3) A free storage capacity (or number of blocks) inside the FMD. As a processing for providing such storage information, the number of segments (or the number of blocks) where failure has occurred in the FMD internal configuration information 2013 may be found and the following calculation may be conducted:

Number of free blocks=(number of blocks in the entire flash memory package)−(number of blocks where failure has occurred)−(number of blocks described in (G2)).

When part of the flash memory package is used for management or internal redundantization, the calculation may be conducted by taking the number of blocks into account (for example, deducting). Furthermore, in the calculation formula presented above, because the block size of the FMP is taken as a reference, it can be recalculated into the block size of the FMD when information is provided.

(G4) Threshold value.

(G5) An alarm when a value obtained by dividing the number of free blocks [D] of (G3) by the number of usable blocks [D] of (G2) is equal to or less than the threshold value of (G4). This alarm may emulate HDD by providing a value identical to that provided when a failure occurred in HDD.

(G6) The number of FMP implemented in the FMD 1030. Furthermore, the number obtained by deducting the number of FMP that were found to be impossible to use due to a failure from the number of FMP carried by the FMD 1030. In addition, the FMD internal configuration information notification program 2014 may send an error message of the I/O request to the controller 1010 in the following cases.

(G7) A voltage or electric power provided to the FMD 1030 is in shortage, or the internal bus of the FMD 1030 or the FMD controller 2010 is damaged.

(G8) Corruption of data saved in the FMD is detected by the FMD controller 2010.

<3.2. Information Managed by Storage System>

FIG. 5 shows a configuration example of FMD information 4050 saved by the controller 1010.

The FMD information 4050 has the following information (H1) through (H5) for each identifier of the FMD 1030 corresponding to each FMD 1030.

(H1) Blockage flag. The blockage flag is Yes in the case of an unusable state for the FMD (for example, when the controller 1010 received a report due to hardware failure, when the FMD 1030 was pulled out, or when the free capacity was small in the FMD 1030 shown in FIG. 2), and No in other cases.

(H2) WWN (World Wide Name). A communication identifier of a Fiber Channel necessary to access the FMD 1030. In an actual Fiber Channel, a Port number is created from the WWN and communication is carried out by using the value thereof. Therefore, the Port number may be registered. In addition, it may be replaced with another identifier (for example, IP address, TCP/IP port number, iSCSI Name, etc.) for communication from the controller 1010 to the FMD 1030.

(H3) LUN (Logical Unit Number). In the present embodiment, because the FMD is provided with only one logical unit, the LU number provided by the FMD may be saved.

(H4) Model number of FMD. Because when the storage system 1000 is used for a long time, a plurality of model numbers are used due to maintenance.

(H5) Capacity, block size, and number of flash memory packages. Of those types of information, at least one type is provided to the controller 1010 by the FMD internal configuration information notification program 2014 of the FMD 1030.

Information representing a physical position installed in the storage system for each FMD 1030 may be also included in the FMD information 4050 (such information is not shown in the figure).

FIG. 6 shows a configuration example of PG configuration information 4060.

The PG configuration information 4060 has the following information (I1) through (I3) for each identifier of respective parity group (PG).

(I1) Blockage flag. The blockage flag is Yes in the case of an unusable state of PG and No in other cases. The unusable state can be represented by the case where a multiplicity of the following events have occurred.

(Event 1) Hardware failure.
(Event 2) FMD 1030 has been pulled out.
(Event 3) The controller 1010 received a report that a free capacity is small in the case of the FMD 1030 shown in FIG. 2.
(I2) RAID level.
(I3) The number of FMD 1030 belonging to a parity group and an identifier of the FMD.

Figure 8:
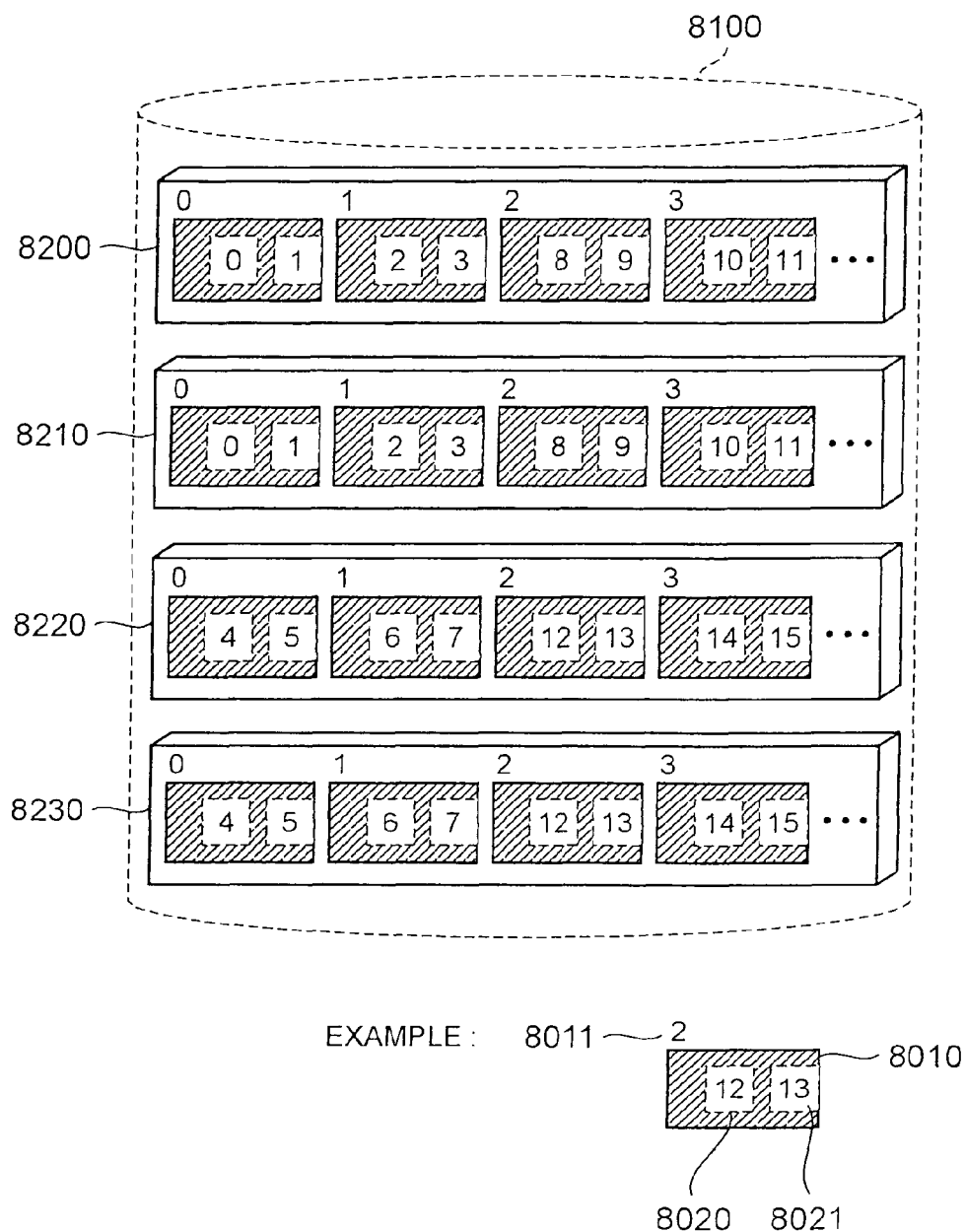
FIG. 8 shows an address space of a parity group of RAID 1+0.

As described hereinabove, the controller 1010 can allocate the address spaces to parity groups. FIG. 8 shows a relationship between an address space [D] of the FMD 1030 and an address group [G] of a parity group for RAID 1+0 taken as an example, FIG. 9 shows a similar relationship for the case where RAID 5 is taken as an example.

Explanation of Examples

Figure 9:
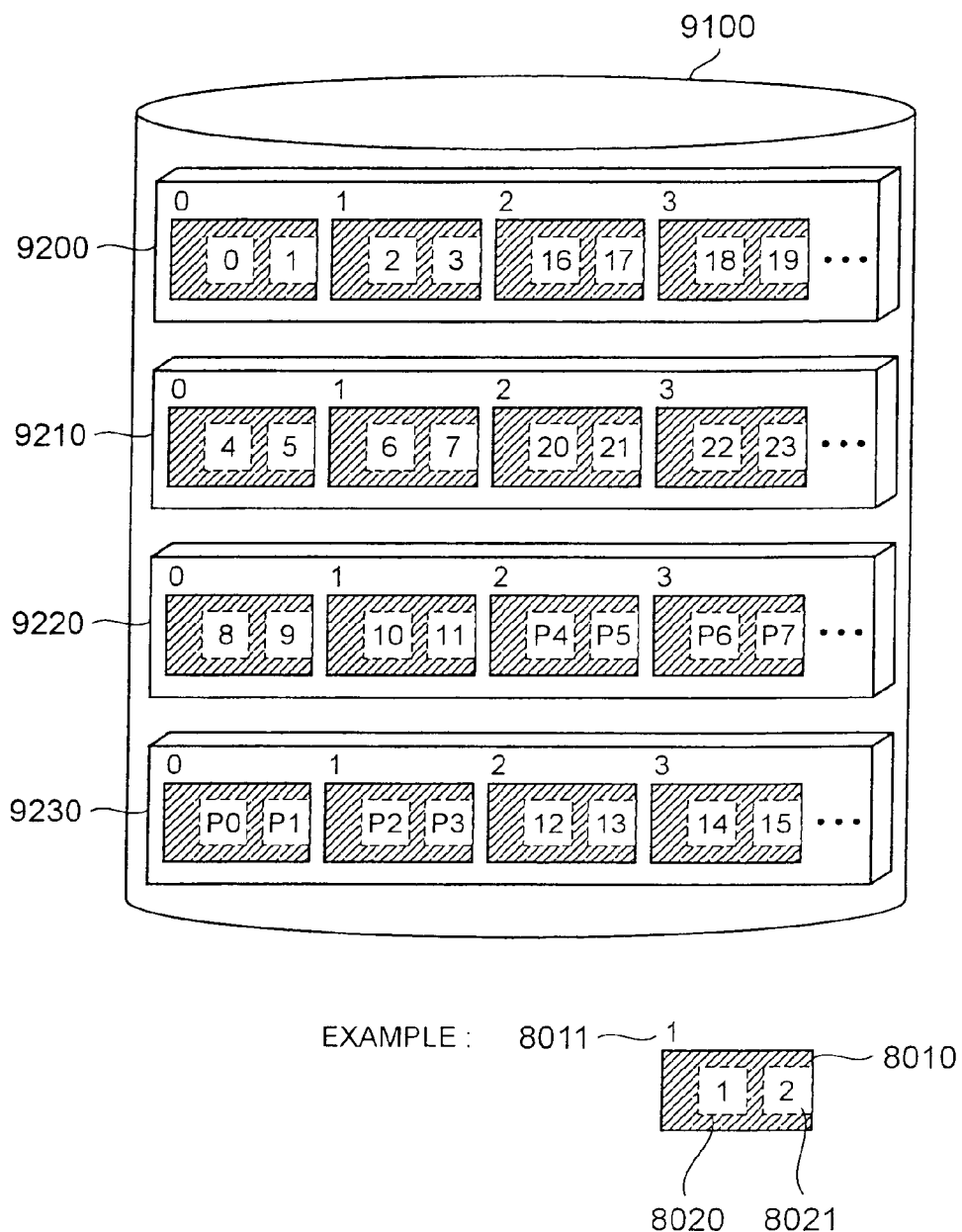
FIG. 9 shows an address space of a parity group of RAID 5.

FIG. 8 and FIG. 9 illustrate a case where a parity group 8100 is configured by using four FMD 8200, 8210, 8222, 8230. The hatched box 8010 shows a block [D] of the FMD, and the block address [D] thereof is shown in 8011. A box 8020 having a dot line frame inside the box 8010 represents a block [G] allocated by the controller 1010 to the parity group 8100, and block address [G] allocated by the controller 1010 is shown in 8021. A block size [G] of the block 8020 can be 512 byte, which is the minimum block size provided by the SCSI standard, but other sizes may be also used. RAID 1+0:

In the case of RAID 1+0, the controller 1010 allocates identical address spaces to two FMD for mirroring and then conducts striping (for example, FMD 8200 and 8210, FMD

8220 and 8230). In the case of striping, the controller 1010 switches the next address space [G] to an another FMD for each determined number of blocks (termed hereinbelow as number of consecutive blocks for striping) (in this example, 4 in block [G] and 2 in block [D]). The stripe size (the I/O size relating to reading and writing data from all the FMD in the parity group) can be calculated by the following formula.

Stripe size=(number of consecutive blocks [G] for striping)×(number of FMD divided by 2)×(block size [G]).

In the case of RAID 1, striping of RAID 1+0 is omitted and the explanation is, therefore, also omitted.

RAID 5:

In the case of RAID 5, the controller 1010 also conducts striping processing and allocates the parity saving areas by using the number of consecutive blocks for striping as a unit (in this example, P3 from the address P0 is an area for saving the parity from address 0 to 11). In the case of RAID 5, the stripe size can be calculated by the following formula.

Stripe size=(number of consecutive blocks [G] for striping)×(number of FMD minus 1)×(block size [G]).

FIG. 7 shows a configuration example of the internal LU configuration information 4070.

The internal LU configuration information 4070 holds the following information (J1) through (J4) for each respective identifier of internal LU. The LU provided as a storage area to the host 1100 is provided to an external unit by defining a path based on the internal LU. The term "external unit" used herein may mean a device of other type, for example, a virtualizling switch or another storage system used instead of or in addition to the host 1100. In other words, the device of other type can issue an I/O request to the storage system, instead of or in addition to the host 1100.

(J1) Blockage flag. The blockage flag is Yes in the case of an unusable state for the internal LU (for example, when the parity groups is blocked or when no area is allocated to the internal LU), and No in other cases.

(J2) PG identifier, start address [G], and end address [G]. They indicate a parity group used as the storage area of the internal LU, a start block address [G] in the parity group, and an end block address [G] in the parity group. The present entry is managed by the controller 1010. Therefore, the block address is managed based on the blocks for the controller. But in this case, it is also possible to prevent a plurality of internal LU from using the same striping or FMD block [D] by employing the values of the start address [G] and end address [G] that take the stripe size or block size of the FMD 1030 into account. When storage areas of a plurality of parity groups are allocated to the internal LU, in the entry of the internal LU configuration information 4070, a plurality of entries will be made for the (J2) information and information for joining the space defined by (J2) will be added.

(J3) Block size [L]. The controller 1010 takes, for example, 512 byte as a block size, but because a larger block size is sometimes desired by the host 1100, the block size based on the assumption of a request from the host 1100 is held.

(J4) Compare flag. The option for designating whether to compare with parity or mirror information when the controller 1010 conducts staging to the cache memory 1020. Reliability can be improved when such comparison is performed.

FIG. 13 shows a configuration example of the LU path information 4080.

For example, the following information (K1) through (K3) is held.

(K1) Identifier of the internal LU provided to the host 1100.

(K2) WWN (or identifier of the I/O port 1013). This information indicates the port 1013 from which the internal LU is provided to the host 1100. As described hereinabove, the WWN may be replaced with an identifier of another type such as a port number.

(K3) LUN

This information indicates as which LUN of the WWN described in (K2) the internal LU to be provided to the host is provided.

Because only limited number of LUN can be defined, it is not necessary to allocate WWN and LUN to all the internal LU defined in the storage system 1000, and the LUN may be used effectively by allocating certain WWN and LUN to the certain internal LU in the some period, and allocating the same WWN and LUN to the another internal LU in another period.

<3.3. Parity Group Definition>

FIG. 14 is a flowchart illustrating the definition processing of a parity group executed by a configuration control program 4030. Each step of the processing will be described below.

(Step 14001) The configuration control program 4030 provides the entire FMD information 4050 or part thereof to the management server 1200, if necessary. The management server 1200 may implement any of the below-described (Method 1) and (Method 2) or both methods.

(Method 1) A group configured based on at least one of the model, size, capacity, and block size is displayed on a display device.

(Method 2) A group configured based on the number of flash memory packages (FMP) is displayed on the display device.

The expression "if necessary", for example, refers to the case where the management server 1200 sends an information request because it is necessary to display the information located inside the controller in response to the users request, and the configuration control program 4030 receives the request from the management server.

(Step 14002) The configuration control program 4030 receives from the management controller 1200 a parity group definition request comprising identifiers of a plurality of FMD 1030 (the identifier can be also replaced by the installation position on a physical storage system or logical identification information) and a RAID level and creates and/or updates the PG configuration information 4060 based on the information (each FMD identifier and RAID level) attached to the request. Defining undesirable parity group configurations may be avoided by adding at least one check processing (or processing displaying the check results) of at least one type from among the below-described (Check 1) through (Check 5) prior to the aforementioned processing.

(Check 1) A check of whether or not at least two of the FMD 1030 from among a plurality of FMD 1030 contained in the parity group definition request are accessible (inducing read and write based on the I/O request) when one of the components (indicates the controller, cache memory, back-end I/O network, etc.), except the FMD, located in the storage system 1000 was blocked by a failure or the like. If the access is impossible, the data recovery processing will fail. This check is aimed at preventing the I/O request from being stopped by a one-point blockage. At a RAID level accompanied by mirroring, such as RAID 1 and RAID 1+0, this check (Check 1) may be performed with respect to both FMD that are in the mirroring relationship.

(Check 2) A check of whether or not the numbers of FMP in all the FMD 1030 designated by the parity group definition request are different. This check is conducted to aid the parity group configuration definition.

(Check 3) A check of whether or not the model numbers in all the FMD 1030 designated by the parity group definition request are different. When the number of FMP is related to the model number of the FMD 1030, this check may be included into (Check 2). However, when the FMD 1020 all having the same model number cannot be designated, e.g., because they are out of stock, it is also possible to define the parity group configuration by ignoring the alarm caused by this check.

(Check 4) A check of whether or not the total storage capacities in all the FMD 1030 designated by the parity group definition request are different. This check is aimed at ensuring effective use of all the storage capacities. However, when the FMD all having the same capacity cannot be designated, e.g., because they are out of stock, it is also possible to define the parity group configuration by ignoring the alarm caused by this check.

(Check 5) A check of whether or not the block sizes [D] of a plurality of FMD 1030 designated by the parity group definition request are different. Because the block size [D] of the FMD becomes a data unit during staging to the cache memory 1020 or destaging, this check serves to reduce the variations of I/O performance inside the parity group.

Furthermore, as Check 6, the configuration control program 4030 may check as to whether or not different storage devices (for example, HDD and FMD 1030) have been designated from one parity group and may report to the management server 1200 in the case where the devices of different type have been designated.

(Step 14003) The configuration control program initializes a parity group (including the creation of mirror data or parity data).

(Step 14004) The configuration control program 4030 changes the blockage flag the parity group corresponding to the PG configuration information 4060 from Yes to No, indicates the possibility of use, and returns a completion message to the management server 1200.

Furthermore, when the number of FMP or total storage capacity can be uniquely specified by the model number of the FMD 1030, the model number list of the FMD for which the definition of parity group is possible may be created for the check of each type by an external device (for example, the computer of the company producing the storage system 1000) of the storage system 1000, and this list may be downloaded into the controller 1010 and used for the check.

<3.4. Internal LU Definition]

Figure 15:
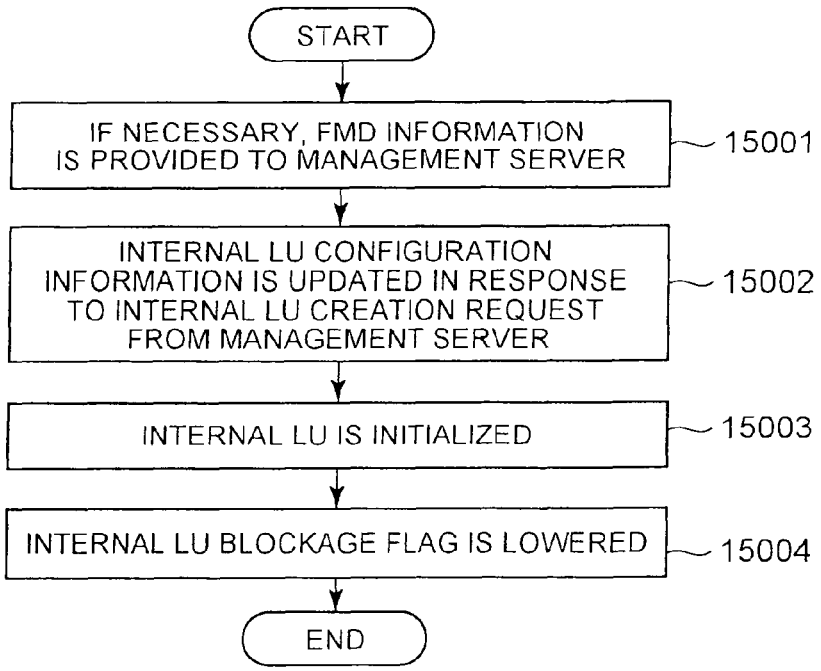
FIG. 15 is a flowchart illustrating the definition processing of an internal LU executed in the configuration control program 4030.

FIG. 15 is a flowchart illustrating the definition processing of an internal LU executed by a configuration control program 4030. Each step of the processing will be described below.

(Step 15001) The configuration control program 4030 sends the entire PG configuration information 4060 or part thereof to the management server 1200 in response to the request from the management server, if necessary.

(Step 15002) Once the configuration control program 4030 receives an internal LU definition request containing information of some or all (Argument 1) through (Argument 5) described below from the management server 1200, it produces and/or updates the internal LU configuration information 4070 based on the information attached to the request.

(Argument 1) Identifier of a parity group.
(Argument 2) Start address [G] of the parity group.
(Argument 3) Storage capacity of the internal LU or end address [G] of the parity group.
(Argument 4) Block size [L] of the internal LU.
(Argument 5) Compare flag of the internal LU.

With respect to (Argument 3), a check may be implemented to avoid one parity data being common for a plurality of internal LU by employing an end address that is an integer multiple of the striping size of the parity group. Furthermore, (Argument 2) and (Argument 3) are taken to be designated by the block size of parity group, but the values of the arguments may be also received by taking a striping size as a unit. Likewise, the arguments may be taken in other formats, provided that the start address [G] and end address [G] of the parity group are eventually found.

(Step 15003) The configuration control program 4030 performs the initialization processing of the internal LU, if necessary. For example, a management area of the internal LU may be created as a link of initialization processing.

(Step 15004) The configuration control program 4030 changes the blockage flag of the internal LU corresponding to the internal LU status information 4070 from Yes to No, indicates that the internal LU can be used, and returns a completion message to the management host.

<3.5. LU Path Definition>

Figure 16:
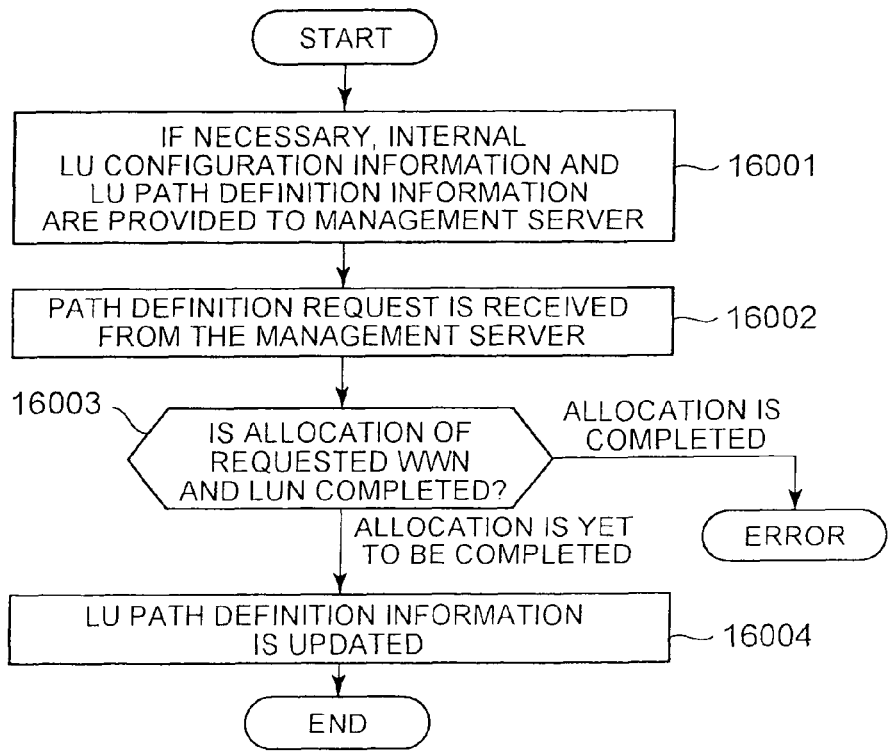
FIG. 16 is a flowchart illustrating the path definition processing of a LU executed in the configuration control program 4030.

FIG. 16 is a flowchart illustrating the LU path definition processing executed by a configuration control program 4030. Each step of the processing will be described below.

(Step 16001) The configuration control program 4030 sends the entire internal LU configuration information 4070 and LU path definition information 4080 or part thereof to the management server 1200 in response to the request from the management server, if necessary.

(Step 16002) The configuration control program 4030 receives from the management server 1200 a path definition request containing an identifier of the internal LU, port information (may be information of other types, provided that it is identification information that can be eventually converted into the WWN or identifier of the I/O port 1013), and LUN.

(Step 16003) The configuration control program 4030 checks whether the allocation of the LUN and WWN designated by the request has been completed, and when the allocation has been completed, responds with error and ends. In the case the allocation has not yet been completed, Step 16004 is executed.

(Step 16004) The configuration control program 4030 creates and/or updates the LU path definition information 4080 based on the information attached to the request and returns a completion message to the management server 1200.

A plurality path definitions may be performed with respect to the internal LU for multiplexing the access path from the host 1100. Furthermore, in the case of release processing of the defined path, the path setting may be released by finding a corresponding entry of the LU path definition information by using the identifier of the internal LU or a combination of WWN and LUN from the management server 1200 and deleting the entry. Furthermore, instead of specifying the WWN and LUN in the LU path definition request, it is also possible to search for and allocate the WWN and LUN emptied by the configuration control program 4030.

<3.6. Blockage Detection>

The configuration control program 4030 detects a component blockage caused by failure, power shutdown, component removal, etc. The flow of the blockage detection processing will be described below.

(L1) The configuration control program 4030 acquires the status of each component. When a component is a controller or FMD, the status of component may be the log or status of the program operating on this component. The program 4030 may use for the processing a report from each component as an inquiry substitute.

(L2) The configuration control program 4030 judges whether blockage of each component is present by checking the acquired status and returns to (L1) where a blockage is absent.

(L3) When a blockage is judged to be present in (L2), the configuration control program 4030 transfers the identifier of the component that was judged to be blocked to the management server 1200 and displays it to the user.

The blockage detection of the FMD 1030 and subsequent dynamic sparing will be described below. A state sometimes occurs in which some of the FMD 1030 cannot be accessed due to the blockage of a component other than the FMD 1030, but the below-described processing (in particular, dynamic sparing) may be also conducted in this state.

<3.6.1. FMD 1030 blockage Detection>

A flow of the FMD 1030 blockage detection processing executed by the configuration control program 4030 will be described below.

(M1) The FMD 1030 returns information or actively sends a report in response to a request from the configuration control program.

(M2) The configuration control program 4030 check the received information and judges whether an FMD blockage is present. Examples of judgment methods are presented below.

(Judgment method 1) In the case of information on the processing error represented by an I/O request error, the judgment is made by the number of receptions (including one and more).

(Judgment method 2) In the case of information relating to the free area described in section 3.1.3 (a value obtained by dividing the number of free blocks (G3) described in section 3.1.3 by the number of FMD block (G2) is considered), the judgment is made by this information becoming less than the predetermined threshold value (this information is held inside the controller 1020 and may be set to the controller 1020 via the management server 1200).

(Judgment method 3) In the case of number of FMP (G6) described in section 3.1.3, the judgment is made by this number becoming equal to or less than a fixed ratio from the shipping time and the number of specifications.

As a variation of FMD implementation, when the judgment method was realized inside the FMD 1030 and was applicable, a report of a device failure similar to that of HDD may be sent to the controller 1010. In this case, the controller 1010 may judge the failure by (Judgment method 1).

(M3) The configuration control program 4030 changes the blockage flag of the FMD that was judged to be blocked with the FMD configuration information 4050 to Yes and indicates that the FMD is unusable.

(M4) The configuration control program 4030 judges whether or not the parity group is in the state where a read/write request cannot be processed due to the blocked FMD 1030 by referring to the PG configuration information and FMD configuration information and, when the processing is impossible, changes the blockage flag of the relevant parity group to Yes (that is, unusable). With the above-described judgment method, in the case of a redundantization system accompanied by mirroring such as RAID 1+0, it is judged whether or not both FMD forming a pair that duplexes the data are in a blocked state, and in the case of RAID 5, a judgment is made as to whether the number of FMD in a blocked sate in the parity group is two or more.

(M5) The configuration control program 4030 changes the blockage flag of the internal LU where data were saved on the blocked parity group to Yes (that is, unusable) by referring to the internal LU configuration information.

(M6) The configuration control program 4030 sends identification information of the blocked FMD 1030 to the management server 1300, if necessary. Information relating to the reason for blockage (for example, when judgment method was used to judge whether the blockage has occurred) may be attached to this notification. Furthermore, when a parity group, internal LU, or LU blocked by the blockage of the FMD 1030 is present, the identification information thereof also may be sent to the management server 1300. The management server 1300 that received the notification displays this information as failure information to the user.

In the explanation below, the state of a parity group that includes the FMD in a blocked state and in which an I/O request is possible will be termed "degenerate state". With an I/O request to a parity group in the degenerate state, a response to the request is made by conducting data recovery processing. The data recovery processing indicates the recovery of data of the blocked FMD from the redundant data. In the case of mirroring, because data identical to those in the blocked FMD are present in another FMD, this processing uses data of the respective FMD. In the case of a parity, this processing conducts recovery by computing the data of the blocked FMD from the parity and data that remained unblocked.

<3.6.2. Dynamic Sparing of FMD>

Dynamic sparing processing performed with the configuration control program 4030 will be described below.

(N1) The configuration control program 4030 waits till FMD blockage is determined with a blockage detection processing.

(N2) The configuration control program 4030 finds a parity group associated with an FMD that was detected to be blocked in N1 (for example, a parity group including the FMD) by referring to the PG configuration information 4060.

(N3) The configuration control program 4030 judges whether or nor the data recovery processing can be executed with respect to the found parity group and when the execution is impossible, abandons the processing (for example, ends). When the execution is possible, the processing of N4 and subsequent steps is performed.

(N4) The configuration control program 4030 searches for an alternative FMD compatible with the parity group. The following conditions analogous to check items or information provided in the parity group definition can be considered as search conditions.

(Condition 1) Data capacity, model, number of FMP, or block size [D] of FMD.

(Condition 2) Selection of FMD 1030 preventing double blocking of the FMD 1030 by one-point blockage of a component other than the FMD (in order to avoid the parity group blockage as effectively as possible).

(N5) The configuration control program 4030 recovers data to the alternative FMD by data recovery processing (will be referred to as recovery copy processing). The specific contents of the recovery copy processing is described hereinbelow by way of an example.

(N5-1) The configuration control program 4030 initially sets the information indicating the copying completion position (copy completion position information) to an initial address of an FMD.

(N5-2) The configuration control program 4030 recovers (by the processing method described in section 3.6.1) the data of the blocked FMD for a plurality of blocks from the copy completion position information and writes them into the alternative FMD.

(N5-3) The configuration control program 4030 advances the copy completion position information by the number of blocks that have been written.

(N5-4) The configuration control program 4030 repeats the processing of (N5-1) through (N5-3) till the copy completion position information advances to the final address of the FMD.

(N6) The configuration control program 4030 registers the alternative FMD anew in the parity group and removes the blocked FMD.

When an FMD is blocked due to shortage of free capacity, a read request relating to the data saved in the FMD is possible. Therefore, data may be read from the blocked FMD, without using parity data or mirror data, as an alternative of the data recovery processing of (N5-2).

With respect to an I/O request to the blocked FMD in the aforementioned recovered copy, because the data have been recovered to the alternative FMD with respect to a block [D] below the copy completion position information, the controller 1010 may return those data to the host 1100 (the case of read) or save the write data in the alternative FMD (the case of write). The controller 1010 can execute the following processing with respect to the block addresses following the copy completion information.

(O1) When a read request was received and the FMD was blocked due to shortage of free area, the data are staged from the blocked FMD to the cache memory as data recovery processing and then the data are returned to the host 1100.

(O2) When a read request was received in a state other than that of (O1), the data saved in the blocked FMD 1030 are recovered to the cache memory 1020 by the data recovery processing and these data are returned to the host 1100.

(O3) When a write request was received, the redundant data (parity data or mirror data) are updated and the write data of the present request can be recovered for subsequent read request or write request.

<3.7. Write Processing>

Figure 17:
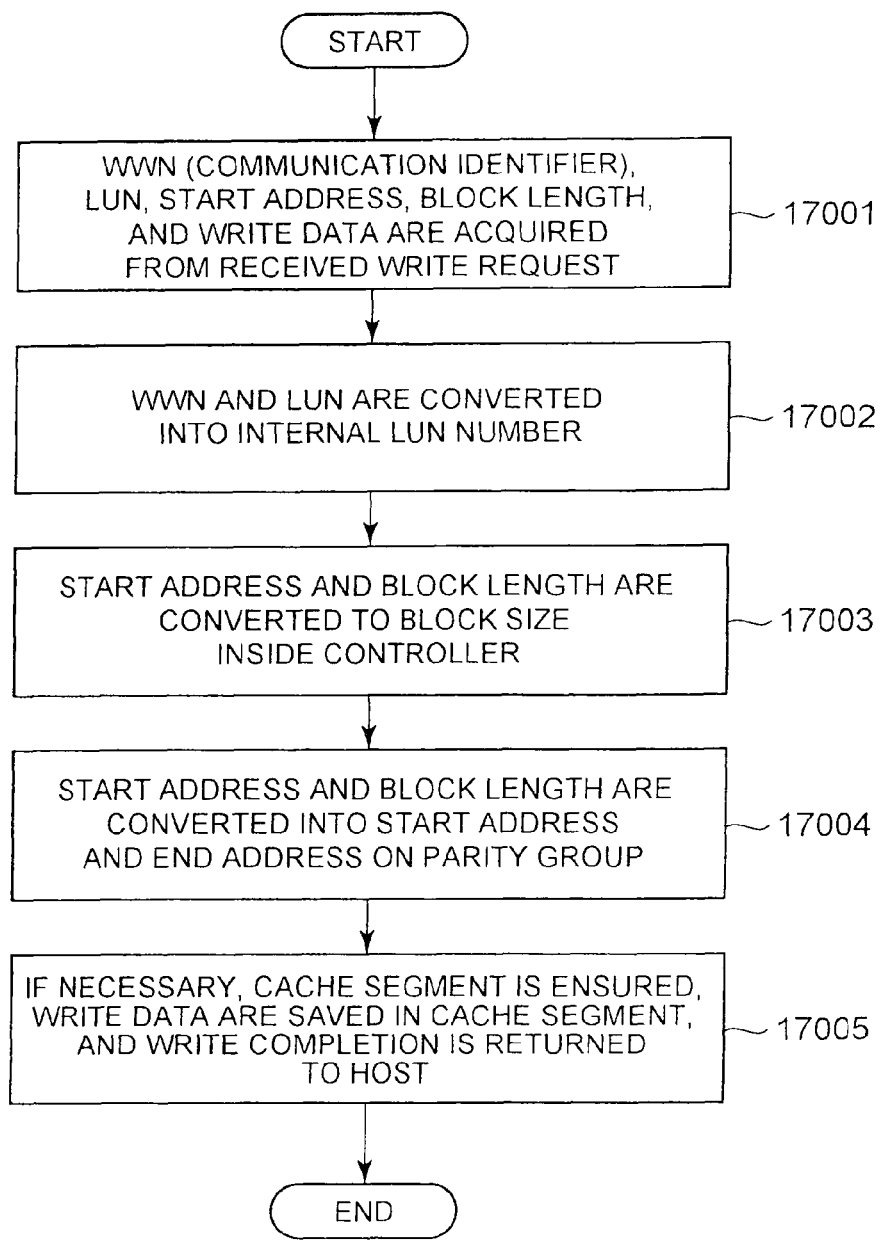
FIG. 17 is a flowchart of processing conducted in the case where the I/O processing program 4010 has received a write request.

FIG. 17 is a flowchart of the processing performed when the I/O processing program 4010 receives a write request. Furthermore, FIG. 10 illustrates schematically an example of data flow or changes on the FMD 8200, FMD 8210, and two cache memories (CM-A and CM-B) of a RAID 1+0 parity group shown in FIG. 8. Furthermore, FIG. 11 and FIG. 12 illustrate schematically the examples of data flow or changes on the FMD 9200, FMD 9230, and two cache memories (CM-A and CM-B) of a RAID 5 parity group shown in FIG. 9.

<3.7.1. Assumptions and Examples of Overview Diagram>

FIGS. 10 through 12 show the flow of data and variation of data between a cache memory and FMD relating to the case where a write request has arrived to a block '3' with respect to an internal LU that was provided to the host 1100 at a block size [L] of 512 B (Byte) and had an area allocated from the head of the parity group. Furthermore, boxes with number symbols therein that are on the cache memory and FMD indicate the block [G] allocated by the controller 1010 to the parity group and the address of the block [G]. In the present example, the FMD block size [D] is twice the block size [G].

In the area management of the cache memory 1020, in order to reduce the information associating a data area on the cache memory and data area on the FMD, the continuous address areas (cache segments) on cache are allocated with a plurality of continuous blocks [D] (in this example, four blocks [G] and two blocks [D]) of the FMD. For this purpose, for example, the controller 1010 manages the below-described attribution information (Q1) through (Q6) for each cache segment.

(Q1) An address on a cache segment.

(Q2) An identifier of a parity group and a block address [G] on a parity group.

(Q3) A staging flag for each block [G] in the cache segment. When a black band is present below the block [G] on the cache in the overview diagram, it means that the data are staged.

(Q4) A dirty (update is completed, but is not reflected in the FMD) flag for each block [G] in the cache segment. In the overview diagram, when a black band is present on a block [G] in the cache block, it means that the block is dirty.

(Q5) Old data flag (6) Parity update required flag. When a black band is present on a box with a symbol P without a number symbol in FIGS. 11 and 12, it means that parity update is required, and when only a box with a symbol P without a number symbol is present, it means that the update is not required.

In both overview diagrams, the explanation will be started from a state in which '0' and '1' of the block [G] have been staged for read.

<3.7.2. Write Request Processing Flow>

The contents of processing conducted when the I/O processing program 4010 receives a write request will be explained below by using the flowchart shown in FIG. 17 and examples from FIG. 10 to FIG. 12.

(Step 17001) The I/O processing program 4010 acquires the WWN, LUN, start block address [L], block length [L], and write data from the write request received by the controller 1010. The controller 1010 reports in advance the block size of the corresponding internal LU in the internal LU configuration information 4070 as the LUN block size [L], this being a repetition, and the block length and start block address of the write request are based on this block size [L]. In an actual write request, a Port ID is contained instead of the WWN. Therefore, the Port ID has to be converted into a WWN.

(Step 17002) The I/O processing program 4010 finds the internal LU number from the WWN, LUN, and LU path definition information. Furthermore, when means other that Fiber Channel is used as a network, Step 17001 and Step 17002 may be replaced with a method other than finding the internal LU number from the write request. For example, in the case of iSCSI, a combination of an IP address and a Port number, or an iSCSI target name replaces the WWN, and the internal LU number can be found by combining with the LUN.

(Step 17003) The I/O processing program 4010, using the internal LU configuration information 4070, converts the start block address [L] and block length [L] of the request into the identifier, start block address [G], and end block address [G] of the parity group. The conversion computation is conducted by the following formulas.

Start block address [G]=(block size [L]*information start block address [L]/block size [G])+(start block address [G] of internal LU configuration information).

End block address [G]=(block size [L]*information block length [L]/block size [G])+start block address [G].

(Step 17005) The I/O processing program 4010 saves the write data on the cache. Where the data of the necessary block [G] have already been staged on the cache at this time, the data on the cache are updated with the write data. However, even when the block data that have already been staged are present, in the present embodiment, the parity update required flag is No (update is completed), and when a dirty flag of the save object block is set (that is, write data that served as a base in the parity update of the previous cycle) have to be used as the old data in the parity update of the present cycle. Therefore, a separate cache segment is ensured and write data are saved. In the case where no write data are present on the cache, if necessary, a cache segment is also ensured and write data are saved.

By saving the write data on both cache memories, the write data can be held even if one cache is blocked. Furthermore, together with saving, the I/O processing program 4010 set a staging flag, a dirty flag, and a parity update required flag, each flag is for the saved block, and returns a response relating to the write request to the host 1100. In (1) in FIG. 10 and FIG. 11, the write data of block [G] '3' are written into two caches and the staging flag and dirty flag are set.

The flow of the I/O processing program 4010 is described above.

<3.7.2 From Parity Creation to Destaging>

Figure 18:
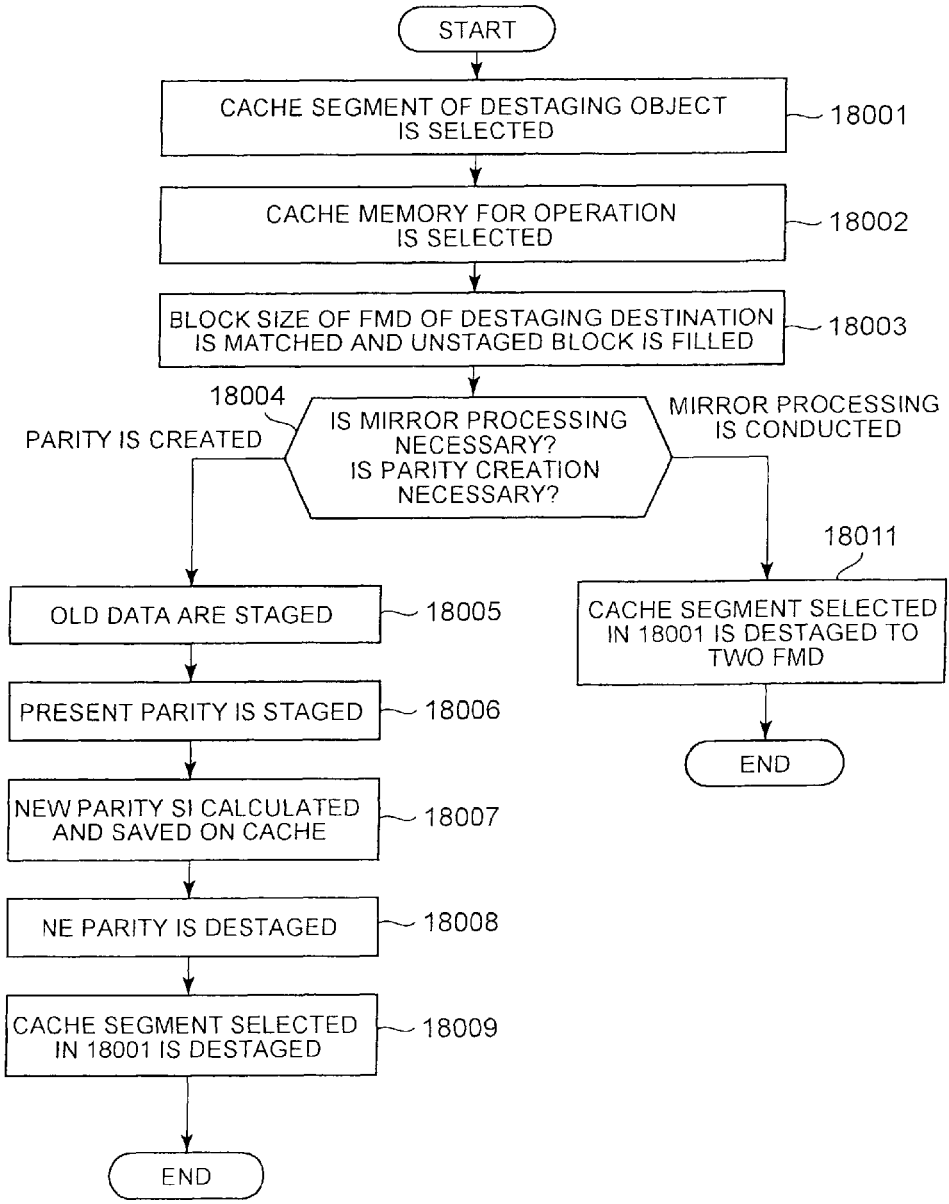
FIG. 18 shows a sequence of parity creation and destaging executed repeatedly by the cache control program 4020.

The sequence of parity creation and destaging executed repeatedly by the cache control program 4020 is shown in FIG. 18.

(Step 18001) The cache control program 4020 selects a cache segment that is a parity creation or destaging target with a cache algorithm such as LRU (Least Recently Used). In FIGS. 10 through 12 (sometimes described hereinbelow as "overview diagrams"), blocks '2' and '3' were selected.

(Step 18002) The cache control program 4020 determines from which of two caches the write data saved therein will be used for parity creation or destaging by a computation formula based on the block address and parity group ID of the cache segment that is the destaging target. In the overview diagrams, the write data on the CM-A are assumed to be used.

(Step 18003) The cache control program 4020 matches the cache segment that is the target of destaging with the block size [D] of the FMD 1030 serving as a destaging destination and fills the block [G] that has not yet been staged in the segment. This is performed to enable the writing of data in block units of the cache memory.

More specifically, when a plurality of blocks [G] present in a cache segment are divided into each FMD block size [D] from the head of the segment (in other words, divided into destaging units). And for each division, if a dirty block [G] is held in and a block [G] in an unstaging state is present in the part of division, data corresponding to the block [G] in the unstaged state are copied from the FMD 1030. In the copying conducted at this stage, initially, a block [D] containing a dirty block [G] (in this example, block '2') and a block [G] in an unstaging state (in this example block '3') in a separate area on the cache is staged and then only the block [G] in the unstaging state is copied. In the overview diagrams (in this example, FIG. 10(1)), block '3' is in an unstaging state.

(Step 18004) The cache control program 4020 performs Step 18005 when parity creation is necessary or Step 18011 when mirroring is necessary with respect to the cache segment that is the destaging target.

(Step 18005) The cache control program 4020 stages the old data saved in the destaging destination FMD 1030 related to the target cache segment for parity generation in a cache segment separate from the cache segment that is the destaging target. This staging may use an area identical to that of the cache segment that was staged by FMD block sizing performed in Step 18003 and may involve staging of the data necessary for the two caches in Step 18003 in advance (in FIG. 11(2) of the overview diagram, the data necessary for the two caches are staged together). Furthermore, if data used for previous parity updating are present on the cache, the staging can be omitted.

(Step 18006) The cache control program 4020 stages a block [D] stored parity corresponding to the cache segment that is the destaging target from the FMD 1020 to the cache segment (in FIG. 11(2) of the overview diagram, blocks 'P2' and 'P3' are staged to CM-B). When a parity that was previously calculated is present on the cache, the staging can be omitted.

(Step 18007) The cache control program 4020 computes a new parity by using the write data on the cache segment that is the destaging target, old data that were staged in Step 18005, and a present parity that was staged in Step 18006, and saves the new parity with setting and saving a dirty flag to a cache segment separate from the present parity. The program 4020 also unsets the parity update required flag of the cache segment that is the destaging target and discards the old data staged in Step 18005 and Step 18006 and the cache segment of the parity. In FIG. 11(3) of the overview diagram, the parity 'P2' of block '2' is dirty.

(Step 18008) The cache control program 4020 destages the cache segment of the new parity computed in Step 18007 and unsets the dirty flag. In FIG. 12(4) of the overview diagram, the parity 'P2' and 'P3' are destaged.

(Step 18009) The cache control program 4020 destages the cache segment that is the destaging target and unsets the dirty flag. When the destaging is completed, write data present on one cache are discarded and destaging is completed. The order of the present step and Step 18008 is not important.

(Step 18011) The cache control program discards data that were staged into another cache segment to fill the block that has not yet been staged in Step 18003. The cache control program 4020 destages the write data of the cache segment that is the target of destaging to two FMD 1030 that are mirror related. This program waits till both destaging operations are completed and then discards write data of one cache. FIG. 10(3) of the overview diagram shows that blocks '2' and '3' from CM-A were destaged.

The above-described processing is the parity creation processing.

The processing contents of destaging that has been used in the above-described processing will be described below.

(R1) The cache control program 4020 converts the block address [G] of the parity group for the cache segment into an FMD identifier and FMD block address [D] by striping computation and block size conversion.

(R2) The cache control program 4020 sends a write request to the FMD found in (R1) with the block address [D] found in (R1).

With respect to a read operation, the cache control program 4020 similarly converts the block address [G] of the parity group into an FMD identifier and FMD block address [D] and sends a read request to the FMD 1030.

Furthermore, in order to increase reliability, the cache control program 4020 may add a redundant code such as LRC or CRC to write data during destaging to the FMD 1030 and check the code during staging. Moreover, the cache control program 4020 may compare the data saved in the FMD and data on the cache after destaging and check that the data are saved securely. In both cases, when the check detects an abnormality, the cache control program 4020 can conduct the FMD blockage detection processing or data recovery processing.

Furthermore, in order to increase reliability with respect to staging corresponding to the internal LU for which the data compare flag of the internal LU configuration information 4070 became Yes, the cache control program 4020 copies the original data from the FMD 1030 to the cache memory 1020 in the case of RAID 1 and also reads and compares data from the other FMD of the mirroring pair. Likewise, in the case of RAID 5, the cache control program 4020 copies the original data from the FMD 1030 to the cache memory 1020 and compares data recovered from another FMD by using parity data and other data and data read from the present FMD. In the case of HDD, the access pattern accompanied by head movement or rotation wait sometimes increases in the recovery processing, and the performance degradation corresponding to or exceeding the increase in the number of I/O request performed in the recovery processing also has to be taken into account, but in the case of FMD, such performance degradation does not require such attention.

<3.8. Read Processing>

Figure 19:
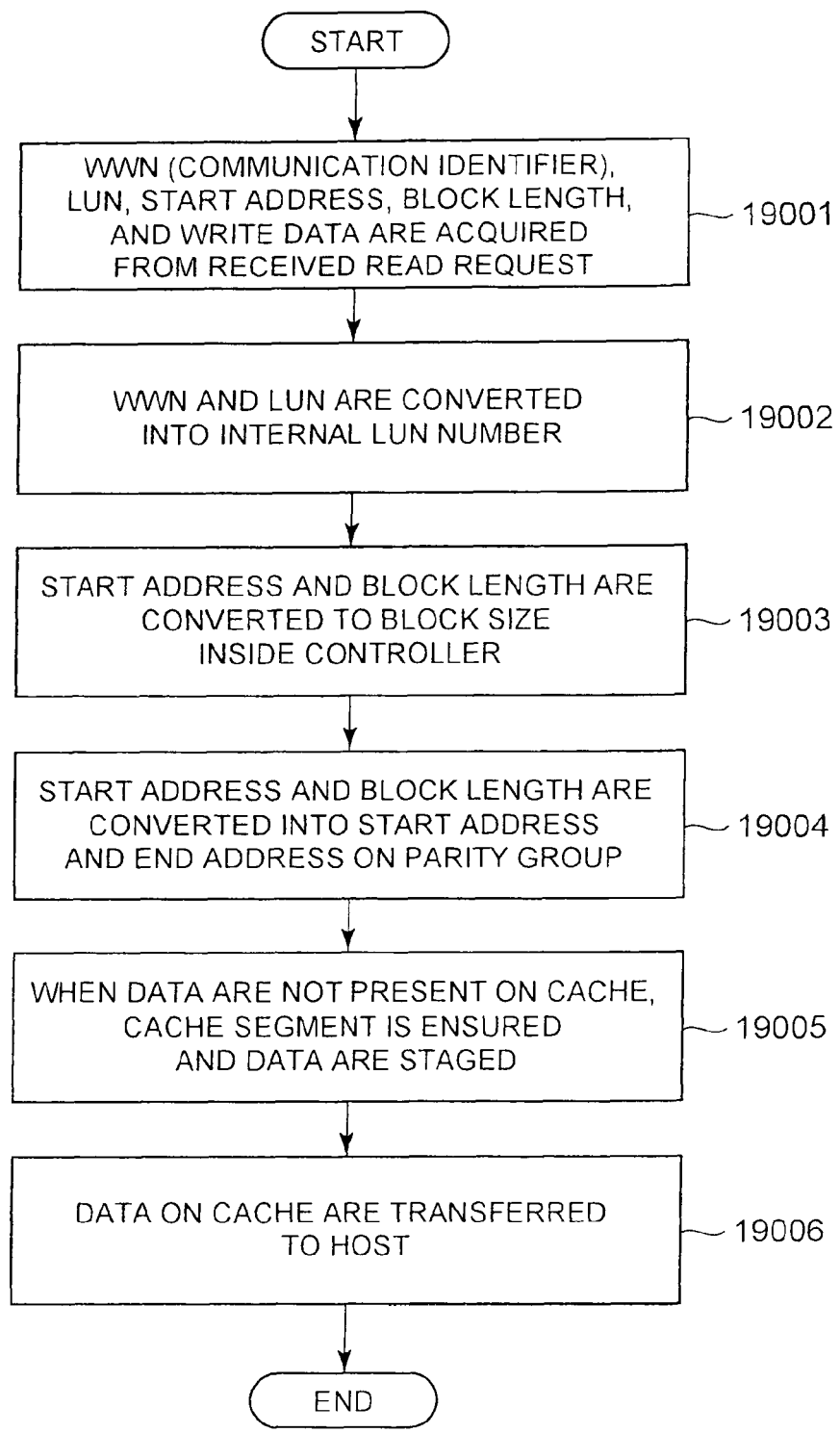
FIG. 19 shows an example of processing flow performed when the I/O processing program 4010 has received a read request.

FIG. 19 shows an example of processing flow performed in the case where the I/O processing program 4010 received a read request. Each step of the processing will be described below.

(Step 19001) The I/O processing program 4010 acquires the WWN, LUN, start block address, block length, and write data from a read request received by the controller 1010.

(Step 19002) The I/O processing program 4010 converts the WWN and LUN into the internal LUN based on the LU path definition information. Step 19001 and Step 19002 may be substituted by the same method as used in the write processing.

(Step 19003) The I/O processing program 4010 converts the start address and block length of a read request (start block address and block length based on the block size that was notified in advance to the host 1100) to a value based on the block length managed inside the controller 1010 by using the internal LU configuration information 4070.

(Step 19004) The I/O processing program 4010 further converts the internal LUN and the converted start block address and block length to a parity group ID, and a start block address and an end block address on the parity group by using the internal LU configuration information 4070. In the computation conducted for the conversion, a value obtained by adding the start block address to the start address of the internal LU configuration information 4070 is used as the start block address on the parity group, and a value obtained by adding the block length to the start block address on the parity group is used as the end block address on the parity group.

(Step 19005) The I/O processing program 4010 checks whether data required by the read request are present in the cache, ensures a cache segment when the required data are not present, and copies the data into the cache by staging processing.

(Step 19006) The I/O processing program 4010 transfers the data on the cache to the host 1100.

The flowchart of the I/O processing program 4010 is described above. The WWN, LUN, start block address, and block length may be checked in any step of the present procedure.

The operations of the present embodiment are sometimes implemented in a mode where the block size of FMD is larger than the block size of LU. This is because the entry amount of the FMD address conversion information 2012 of an FMD is related to a value obtained by dividing the storage capacity of the FMD by the block size, the entry amount will supposedly increase in the future, the search time for finding data required by the I/O request will therefore increase, and the block size of FMD will be as large as 8192 byte. On the other hand, in the usual host, the block size is presently based on 512 B. This, however, does not negate other relationships. If the block size of LU is equal to or larger than the block size of FMD, the efficiency of staging and destaging on the cache will apparently be good. Therefore, it is also possible that this configuration will be actively employed.

Furthermore, the storage system 1000 is not required to be configured of one device. For example, the FMD 1030 and controller 1010 can be present as separate devices connected by a backend I/O network. Furthermore, an access control program that limits the hosts that can access the LU can be added to the controller 1010, or a local replication program for producing a LU replica inside the same storage system 1000 or a remote mirroring program for conducting mirroring into different storage systems may be executed. More specifically, for example, when remote mirroring is performed, a storage system using the FMD 1030 in the copy source and copy destination can be employed. The implementation of remote mirroring can be also considered in which the storage system 1000 using the FMD 1030 is employed for the storage system of the copy source, and a storage using a HDD is employed for the storage system of the copy destination. This is because the performance characteristics and bit costs of the FMD 1030 and HDD are different and also because failure resistance can be increased due to the fact that the environments where data loss or corruption can easily occur (for example, including at least one of temperature, humidity, X rays, electric field, and magnetic field) are different for the two storages since a flash memory contained in the FMD holds data by operating electric charges, whereas data in the HDD are held by magnetism.

The explanation will be continued hereinbelow.

<4. Substitute Device of FMD 1030>

<4.1. SFMD 1030 (2)>

Figure 21:
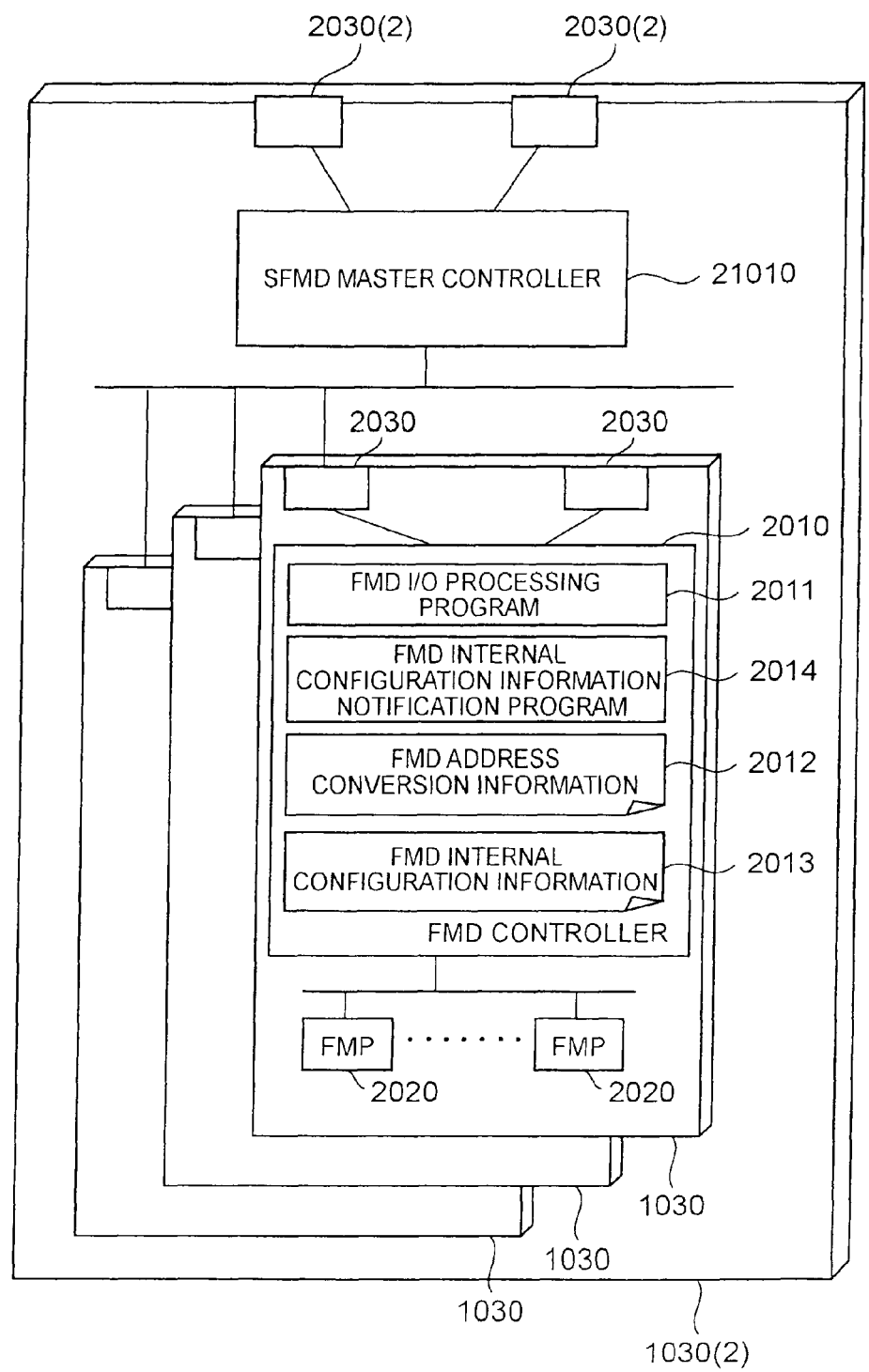
FIG. 21 shows a configuration example of SFMD 1030 that is one of the variations of the FMD 1030.

Several variations can be considered for the FMD 1030. An example thereof is shown in FIG. 21.

The SFMD 1030(2) is a substitute device for FMD 1030. SFMD 1030(2) comprises a SFMD master controller 21010, a plurality of I/O ports 2030(2), and a plurality of FMD 1030. Each FMD 1030 is connected to the SFMD master controller 21010 via the I/O port 2030. The I/O port 2030 may be substituted with the internal bus, and a configuration in which one I/O port 2030 is connected, as shown in the figure) or a configuration in which a plurality of I/O ports are connected is possible. In FMD 1030 contained in one SFMD 1030(2) the following items (T1 to T3) are preferably identical.

(T1) Storage capacity [D].

(T2) Block size [D].

(T3) Performance of FMD controller 2010.

The SFMD master controller 21010 performs striping processing to provide a plurality of FMD 1030 together to one storage area. Thus, when the controller 1010 accesses the SFMD 1030(2), not only the address space [D] of the FMD 1030, but also a new address space [SD] is used. The SFMD master controller 21010 that has received an I/O request conducts striping processing, thereby obtaining the FMD 1030 where the data have been saved and the start address [D] and block length [D] thereof from the start address [SD] and block length [SD] contained in the I/O request, and sends an I/O request. When the block length [SD] of the I/O request to the SFMD 1030(2) is large, the above-described conversion and sending of the I/O request to the FMD 1030 are conducted during the data reception or data transmission. They are in the same manner as in the case of FMD 1030.

The block size [SD] of the SFMD 1030(2) is preferably equal to the block size [D] of the FMD 1030. Furthermore, the number of blocks [SD] (or storage capacity [SD]) of the SFMD 1030(2) may be equal to the total of the number of blocks [D] (or storage capacity [D]) of the FMD 1030 contained therein, but when part of blocks [D] of the FMD 1030 are used for the purpose of control, the number of blocks [SD] may be obtained by subtracting the corresponding number of blocks from the total number.

The SFMD master controller 21010 can send the below-described information (U1) through (U4) to the controller 1010.

(U1) Number of blocks [SD]
(U2) Block size [SD].
(U3) Number of free blocks [SD].
(U4) Number of FMP 2020 and/or number of FMD 1030.

The SFMD master controller 21010 may send the entire information provided by the FMD internal configuration information notification program 2013 or part thereof to the controller 1010 in addition to the above-described information.

By contrast with the FMD 1030, in the SFMD 1030(2), a write request fails at the point in time in which the number of free blocks in a certain FMD 1030 becomes zero, even if the number of free blocks in other FMD 1030 is more than zero. For this reason, reporting a minimum value (or a number obtained by multiplying the minimum value by the number of FMD 1030) of the number of free blocks in each FMD 1030 can be considered for the value of the number of free blocks [SD] of (U3).

The SFMD 1030(2) has the following drawback and advantage when compared with the FMD 1030.

(Drawback) FMP utilization efficiency is poor. Depending on the access pattern, write requests can be collected in a specific FMD 1030. Therefore, the time till the component being blocked is short.

(Advantage) The number of bottleneck locations is small. The free area management or address conversion performed by the FMD controller 2010 is the processing with a rather large workload because a search of FMD address conversion information 2012 is necessary. Therefore, even if the number of FMP contained in the FMD 1030 is increased, the performance is sometimes not increased due to bottlenecks in the FMD controller 21010. By employing a method by which the block size [D] is increased so that decreasing the size of the FMD address conversion information 2012 that is searched during address conversion of the FMD 1030, this can be avoided and improving performance. However, if the block size is too large, performance is degraded because in an environment with multiple random access, staging or destaging is executed to the data that are not directly related to the access. In the case of SFMD 1030(2), because address conversion is processed in a distributed fashion in a plurality of FMD controllers 2010, the bottleneck is prevented and it is not necessary to increase the block size even when a large number of high-capacity FMP are installed.

In order to overcome the above-described drawback, the processing of at least one of the below-described types performed in the controller 1010 can be also executed in the SFMD master controller 21010.

(Processing 1) Dynamic sparing. Some of FMD 1030 contained in the SFMD 1030(2) are used for spare, and dynamic sparing is conducted when the number of free blocks of the operating FMD 1030 becomes small. The FMP utilization efficiency decreases to allocate the redundant areas, but the time to component blockage caused by the access concentration in a specific FMD 1030 is increased.

(Processing 2) Redundant data such as mirroring or parity are added.

With respect to the presence or absence of the above-described treatment, sending the information by the SFMD master controller 21010 in response to the request from the controller 1010 can be considered. Furthermore, if the presence or absence of the processing is made clear by the model of the SFMD 1030(2), the above-described information acquisition may be replaced with acquisition of this information by the controller 1010.

<4.2. SFMD and FMD Mixed Storage System>

The SFMD 1030(2) and FMD 1030 can send a read request or write request by the same method from the controller 1010. For this purpose, the storage system 1000 can implement a plurality of SFMD 1030(2), such a configuration also makes it possible to execute the processing that was heretofore explained. Furthermore, the storage system 1000 can also implement both the SFMD 1030(2) and FMD 1030. Such a configuration can originate for the same reason as associated with the difference in the number of FMP in the FMD 1030.

In this case, because of the difference in I/O characteristics caused by the internal structures and because the time (endurance) to the blockage differs between the SFMD 1030(2) and FMD 1030, a configuration can be employed in which the SFMD 1030(2) and FMD 1030 are not mixed in a parity group. In order to realize such configuration, the controller 1010 acquires information relating to the internal structure of both devices and provides this information to the user at the time of parity group configuration definition or uses the information for check processing. Furthermore, user can use the storage system efficiently with considering storage hierarchy by displaying whether the LU is configured of SFMD 1030(2) or FMD 1030. However, both devices may be mixed in a parity group with consideration for device shortage and other reasons.

Furthermore, because the SFMD 1030(2) can increase reliability by adding the dynamic sparing and/or redundant data instead of increasing the number of internal components, it can be considered to acquire the internal structure (including presence and/or absence of dynamic sparing or redundant data) with the controller 1010 in the same manner as described above, and further to configure a parity group only of the devices with dynamic sparing or to configure a parity group only of the devices with redundant data in the SFMD 1030(2).

<5. Substitute Device of FMD 1030, Part 2>
<5.1. Multi-LU-FMD>

In the explanation above, the FMD 1030 or FMD 1030(2) provided one LU to the controller 1010. However, for this purpose, the device has to be provided at least with a striping function such as SFMD master controller 21010. As a result, the production cost of the FMD can increase.

Figure 22:
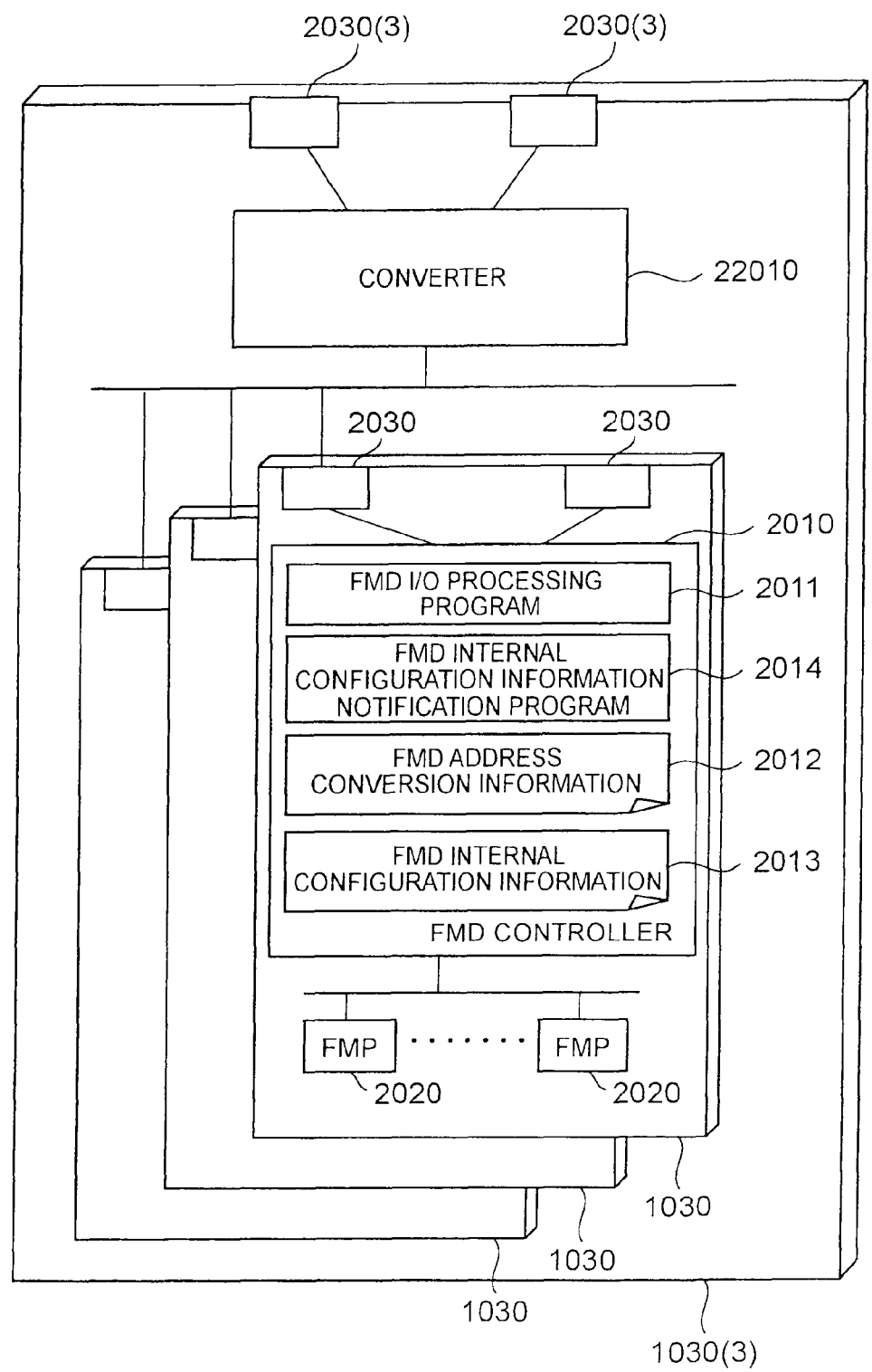
FIG. 22 shows a configuration example of the multi-LU-FMD 1030 (3) that is one of the variations of the FMD 1030.

The multi-LU FMD 1030(3) shown in FIG. 22 provides a plurality of internalFMD 1030 to the controller 1010. As an example, a method for providing each FMD 1030 as a LU belonging to a WWN held by the I/O port 203(3) can be considered. For example, a converter 22010 allocates the access request to the FMD 1030 designated by the LUN and performs the conversion processing in the case where the port 2030 of the FMD 1030 is a transfer medium other than the port 2030(2). On the other hand, the controller 1010 recognizes a plurality of FMD 1030 contained in the multi-LU-FMD 1030(3) and manages failure occurrence in the units of the FMD 1030. A maintenance operator can perform maintenance and replacement in the units of multi-LU-FMD 1030 (3).

<5.3. Parity Group Configuration Using multi-LU-FMD 1030(3)>

In case of configuring a parity group by using a multi-LU-FMD 1030(3), it is necessary to prevent the controller 1010 from configuring a parity group by selecting a plurality of FMD 1030 from a certain multi-LU-FMD 1030(3). This is because a multi-LU-FMD 1030(3) is a unit of one of the unit of physical failure, a unit of power source shut-down, and a unit of pulling out a device. So that, in case of a device failure occurs in a state where a plurality of FMD 1030 have been used in the same multi-LU-FMD 1030(3), then the data recovery processing of a parity group becomes impossible.

In order to assist the above-described parity group configuration, the controller 1010 can use the below-described two methods for defining the parity group configuration.

(Method 1) During definition of a parity group configuration, the controller 1010 displays a correspondence relationship of multi-LU-FMD 1030(3) and FMD 1030 contained therein with a GUI (Graphical User Interface, GUI is for example) and receives a designation of a plurality of FMD 1030 from the user. The controller 1010 that received this designation checks whether some of a plurality of designated FMD 1030 belong to the same multi-LU-FMD 1030 (3).

Figure 23:
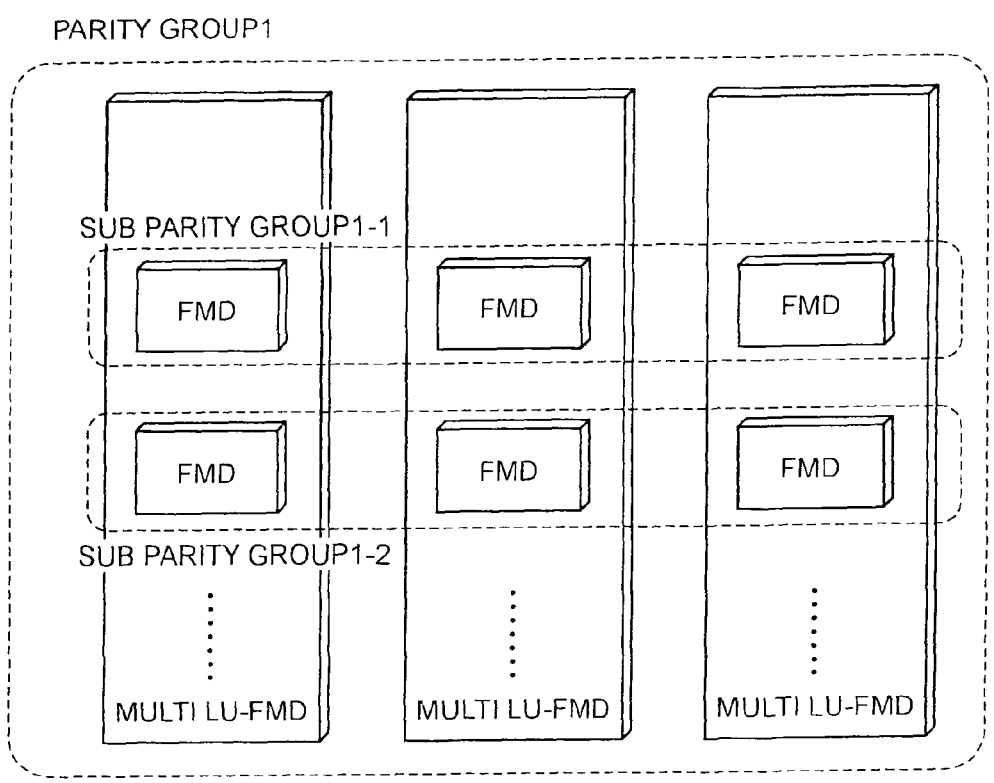
FIG. 23 shows an example of a sub-parity group configured of FMD 1030 of the multi-LU-FMD 1030 (3) shown in FIG. 22.

(Method 2) When a parity group configuration is defined, the controller 1010 displays a list of multi-LU-FMD 1030(3) with a GUI (GUI is for example) and receives a designation of a plurality of multi-LU-FMD 1030 (3) from the user. The controller 1010 that received this designation checks whether number of the FMD 1030 installed and storage capacity about the multi-LU-FMD 1030 (3) is same among the a plurality of the designated multi-LU-FMD 1030 (3). Then, as shown by way of an example in FIG. 23, the controller 1010 defines a sub-parity group configuration using plural FMD 1030, each belongs to each multi-LU-FMD 1030(3) and further uses a plurality of sub-parity groups located in the multi-LU-FMDs 1030(3) by taking areas joined by concatenating or the like as a parity group, and provides the parity groups to the user. The term "concatenating", for example, when related to concatenating LU2 to LU1, means that the head of the address space of LU2 is joined to the end of the address space of LU1. Furthermore, joining sub-parity groups can be achieved by striping.

<5.3. Dynamic Sparing and Blockage Detection>

When multi-LU-FMD 1030(3) are used, the write requests can be also concentrated in a specific FMD 1030 similarly to the case of SFMD 1030(2). For this reason, the controller 1010 knows a free capacity of each FMD in each multi-LU-FMD 1030(3) and, when the number of free blocks decreases for any FMD 1030, performs dynamic sparing of this FMD 1030 to an FMD 1030 contained in another multi-LU-FMD 1030(3). Alternatively, a next method can be considered. An FMD 1030 for sparing is prepared at the time each multi-LU-FMD 1030(3) is started to be used, and when the number of free blocks of a certain FMD 1030 decreases, dynamic sparing is performed from this FMD 1030 to an FMD 1030 for sparing that is contained in the same multi-LU-FMD 1030(3) as this FMD 1030. In yet another possible method, when an FMD 1030 for sparing is absent in the multi-LU-FMD 1030 (3) for which the number of free blocks has decreased, the controller 1010 uses an FMD of another multi-LU-FMD 1030(3) as its own FMD 1030 for sparing. Furthermore, the controller 1010 (for example, a configuration information program 4030) can make an FMD 1030 for sparing of copy destination to be an element of a parity group (or sub-parity group) to which an FMD 1030 of copy source belonged and can remove this FMD 1030 of copy source from the parity group (or sub-parity group). More specifically, for example, an ID of the FMD 1030 for sparing of copy destination can be added to a column corresponding to the parity group (or sub-parity group) in a PG configuration information 4060 and the ID of the FMD 1030 of copy source can be deleted from the column.

The above-described processing is also suitable for storage systems containing multi-LU-FMD 1030(3). For example, when the user defines a parity group configuration, the number of the contained FMD or the number of FMD 1030 is acquired from each multi-LU-FMD 1030 and parity groups are configured of the same number of identical devices.

Furthermore, where a storage system contains multi-LU-FMD 1030(3), blockage detection can be performed in FMD 1030 units. Therefore, in this embodiment considering sub-parity group, the recovery processing an I/O processing is possible or not required, in case of the recovery processing as a parity group like a previous embodiment. If an internal LU is configured only of sub-parity groups for which such I/O request can be processed, the controller 1010 may continue the I/O request, without blocking the internal LU, even when the data recovery processing was judged to be impossible for the parity group like a previous embodiment.

Using multi-LU-FMD 1030(3) as a storage medium, controller 1010 need to manage (for example, blockage detection and management) more devices than SFMD 1030(2) case and FMD 1030 case. So, each three types of FMD has a technical merit, and two or more type of FMD can be mixed in the storage system.

An embodiment of the present invention was described above, but it merely illustrates the present invention, and it is to be understood that the scope of the present invention is not limited to this embodiment. The present invention can be carried out in a variety of other modes. For example, the controller 1010 can employ another configuration. For example, instead of the above-described configuration, the controller may comprise a plurality of first control units (for example, control circuit boards) for controlling the communication with a higher-level device, a plurality of second control units (for example, control circuit boards) for controlling the communication with the FMD 1030, a cache memory capable of storing data exchanged between the higher-level device and FMD 1030, a control memory capable of storing data for controlling the storage system 1000, and a connection unit (for example, a switch such as a cross-bus switch) for connecting the first control units, second control units, cache memory, and control memory. In this case, one of the first control units and second control units or a combination thereof can perform processing as the above-described controller 1010. The control memory may be absent; in this case, an area for storing information for storage by the control memory may be provided in a cache memory.

Further, In case of FMD controller 2010 has a maximum number of concurrent access to the plural FMP, all three types of FMD may be report the number instead of the number of FMP implemented in the FMD (especially, the number is used for the performance consideration).

What is claimed is:

1. A storage system comprising:
    a plurality of flash memory devices (FMDs), each of the plurality of FMDs including a first controller and a plurality of first flash memory packages configured to store data; and
    a storage controller coupled to the plurality of FMDs and a plurality of hard disk drives (HDDs), the storage controller processing an input/output (I/O) request from an external device to the plurality of FMDs or the plurality of HDDs,
    wherein at least one first controller of the plurality of FMDs computes a first parity for data stored in the plurality of first flash memory packages included in at least one of the plurality of FMDs.

2. The storage system according to claim 1, wherein the storage controller computes a second parity for data stored in the HDDs.

3. The storage system according to claim 2, wherein each first controller in the plurality of FMDs configures a first parity group with the first flash memory packages.

4. The storage system according to claim 3, wherein the HDDs are not included in the first parity group.

5. The storage system according to claim 1, wherein the storage controller is coupled to a plurality of second flash memory devices and configures a second parity group with the plurality of second flash memory devices.

6. The storage system according to claim 1, wherein the storage controller configures a third parity group with the plurality of FMDs.

* * * * *